United States Patent
Yaegashi

(10) Patent No.: US 8,497,502 B2
(45) Date of Patent: Jul. 30, 2013

(54) THIN FILM FIELD EFFECT TRANSISTOR AND DISPLAY

(75) Inventor: Hiroyuki Yaegashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 8 days.

(21) Appl. No.: 12/490,321

(22) Filed: Jun. 24, 2009

(65) Prior Publication Data

US 2010/0163863 A1    Jul. 1, 2010

(30) Foreign Application Priority Data

Jun. 24, 2008 (JP) ................................. 2008-164653

(51) Int. Cl.
*H01L 29/10* (2006.01)
(52) U.S. Cl.
USPC ............... 257/43; 257/57; 257/59; 257/66; 257/E29.296
(58) Field of Classification Search
USPC ............................................ 257/43, E29.296
See application file for complete search history.

(56) References Cited

U.S. PATENT DOCUMENTS

| 2007/0085475 | A1* | 4/2007 | Kuwabara et al. | 313/506 |
| 2008/0191204 | A1* | 8/2008 | Kim et al. | 257/43 |
| 2009/0236596 | A1* | 9/2009 | Itai | 257/43 |
| 2010/0073268 | A1* | 3/2010 | Matsunaga et al. | 345/76 |
| 2010/0140612 | A1* | 6/2010 | Omura et al. | 257/43 |

FOREIGN PATENT DOCUMENTS

| JP | 2006-165529 A | 6/2006 |
| JP | 2007-073705 A | 3/2007 |
| JP | 2007-299913 A | 11/2007 |

\* cited by examiner

*Primary Examiner* — Hsin-Yi Hsieh
(74) *Attorney, Agent, or Firm* — SOLARIS Intellectual Property Group, PLLC

(57) ABSTRACT

A thin film field effect transistor includes at least: a substrate; and a gate electrode, a gate insulating layer, an active layer, a source electrode and a drain electrode, and a protective layer provided on the substrate in this order from the substrate side. The active layer is a layer containing an amorphous oxide containing at least one metal selected from the group consisting of In, Sn, Zn and Cd. The thin film field effect transistor further includes, between the active layer and at least one of the source electrode or the drain electrode, an electric resistance layer containing an oxide or nitride containing at least one metal selected from the group consisting of Ga, Al, Mg, Ca and Si.

10 Claims, 2 Drawing Sheets

THIN FILM FIELD EFFECT TRANSISTOR AND DISPLAY

CROSS-REFERENCE TO RELATED APPLICATION

This application claims priority under 35 USC 119 from Japanese Patent Application No. 2008-164653, the disclosure of which is incorporated by reference herein.

BACKGROUND OF THE INVENTION

1. Field of the Invention

The present invention relates to a thin film field effect transistor and a display using the same. Particularly, it relates to a thin film field effect transistor in which an amorphous oxide semiconductor is used for an active layer, and a display using the same.

2. Description of the Related Art

In recent years, flat panel displays (FPDs) have been put to practical use, due to the progress made in liquid crystal and electroluminescence (EL) technologies, etc. Especially, an organic electroluminescence element (hereinafter referred to as an "organic EL element" in some cases) formed using a thin film material which emits light by excitation due to application of electric current can provide light emission of high brightness at low voltage, and thus is expected to obtain effects such as reduction in device thickness, weight, and size, and power saving in wide ranging applications including mobile phone displays, personal digital assistants (PDA), computer displays, car information displays, TV monitors, and general illumination.

These FPDs are driven by an active matrix circuit including thin film field effect transistors each using, as an active layer, an amorphous silicon thin film or a polycrystalline silicon thin film provided on a glass substrate. (In the description below, the thin film field effect transistor is sometimes referred to as a "thin film transistor" or "TFT".)

On the other hand, to make the FPD thinner, lighter, and more resistant to breakage, attempts are being made to use a resin substrate which is light in weight and flexible, instead of the glass substrate.

However, fabrication of the transistors using the silicon thin films described above requires a thermal treatment process at a relatively high temperature, and it is difficult to form the transistors directly on resin substrates, which are generally low in heat resistance.

For example, a MOSFET (metal-oxide semiconductor field effect transistor), which reduces a driving voltage of a transistor that uses a silicon thin film, is disclosed, and a configuration in which indium tin oxide (ITO), tin oxide or zinc oxide is used as a semiconductor material of an active layer and a dielectric material having a large dielectric constant is used in a gate insulating layer is disclosed. However, ITO, tin oxide or zinc oxide is a crystalline metal oxide. In order to obtain desired semiconductor characteristics using the crystalline metal oxide in an active layer, it is necessary to conduct a high temperature heat treatment step for regulation of the crystallization, such as post annealing at 300° C. for 15 minutes, after film formation by sputtering. Accordingly, such an active layer is difficult to form directly on a resin substrate that is poor in heat resistance.

Amorphous oxides, such as In—Ga—Zn—O-based amorphous oxides, can form a film at low temperatures, and have been attracting attention as a material that can form a film on a plastic film at room temperature.

However, a TFT using an amorphous oxide semiconductor has problems of high OFF current and low ON/OFF ratio.

Further, it is reported that when a TFT in which an amorphous oxide semiconductor is used as an active layer contacts with epoxy resin or acrylic resin, which is a common protective layer material, and repeatedly driven, the TFT exhibits unstable behavior in that the threshold voltage for allowing a current to flow varies each time. In order to prevent this, for example, Japanese Patent Application Laid-Open (JP-A) No. 2007-299913 discloses a method of covering the active layer with an inorganic insulating layer or a fully fluorinated resin to avoid direct contact of the active layer with a protective layer.

Further, JP-A No. 2007-73705 mentions a problem in that a TFT having an active layer formed of an amorphous oxide semiconductor exhibits changes in characteristics due to the influence of gas components (oxygen gas and nitrogen gas) and moisture in an atmosphere during storage, and discloses covering the channel portion with a protective layer constituted of a silicon resin or the like.

SUMMARY OF THE INVENTION

However, when an inorganic insulating layer and the like as a protective layer of the active layer is formed on the active layer in order to avoid the contact of the active layer with a non-fluorinated resin, there is a problem in increase of the number of processes that is caused by inclusion of processes for separately patterning the active layer and the protective layer of the active layer. In addition, the problems of high OFF current and low ON/OFF ratio are not solved by the protective layer described above, and still remain as issues to be solved.

The present invention has been made in view of the above circumstances and provides a thin film field effect transistor (hereinafter referred to as "TFT" in some cases) and a display using the same.

An aspect of the invention provides a thin film field effect transistor including at least: a substrate; and a gate electrode, a gate insulating layer, an active layer, a source electrode and a drain electrode, and a protective layer provided on the substrate in this order from the substrate side, wherein the active layer is a layer containing an amorphous oxide containing at least one metal selected from the group consisting of In, Sn, Zn and Cd, and the thin film field effect transistor further includes an electric resistance layer containing an oxide or a nitride containing at least one metal selected from the group consisting of Ga, Al, Mg, Ca and Si between the active layer and at least one of the source electrode or the drain electrode.

DETAILED DESCRIPTION OF THE INVENTION

Figure 1:
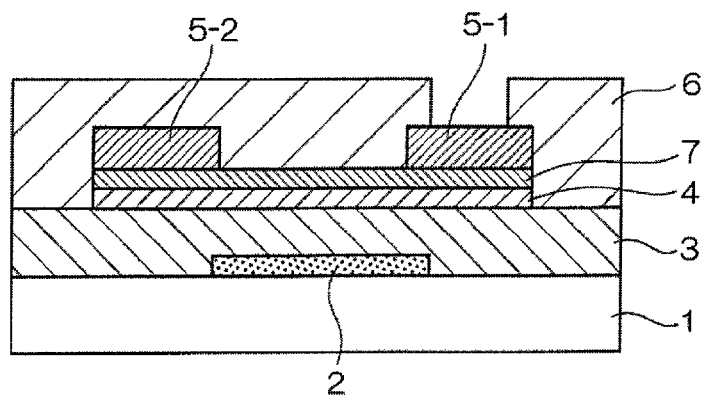
FIG. 1 is a schematic diagram showing a TFT element structure according to the invention.

1. Thin Film Field Effect Transistor (TFT)

The thin film field effect transistor of the invention is an active element which includes at least: a substrate; and a gate electrode, a gate insulating layer, an active layer, a source electrode and a drain electrode, and a protective layer provided on the substrate in this order from the substrate side, wherein the active element has a function of switching the current flowing between the source electrode and the drain electrode by regulating the current passing through the active layer by applying a voltage to the gate electrode. The TFT structure may be either a staggered structure or an inverted staggered structure.

The active layer of the TFT of the invention is a layer containing an amorphous oxide containing at least one metal selected from the group consisting of In, Sn, Zn and Cd, and the TFT includes, between the active layer and at least one of the source electrode or the drain electrode, an electric resistance layer containing an oxide or nitride containing at least one metal selected from the group consisting of Ga, Al, Mg, Ca and Si.

In the channel region of the active layer in the constitution of the invention, the active layer is disposed such that the active layer is separated from the protective layer by the electric resistance layer located therebetween. Accordingly, since a surface of the active layer that is perpendicular to the thickness direction of the active layer does not contact directly with the protective layer, degradation in TFT performance of the active layer is prevented even when the protective layer is constituted of a resin.

Further, there is a problem in that an active layer containing an amorphous oxide is corroded by a chemical etching liquid, which makes it difficult to utilize a chemical etching method for patterning a layer provided thereon. However, the electric resistance layer of the invention has an advantage of excellent chemical resistance, and, therefore, the above layer arrangement makes it possible to pattern the source electrode and the drain electrode by chemical etching, whereby the TFT productivity is increased.

The protective layer in the invention preferably includes a photosensitive resin and is preferably patterned and formed using a lithographic method.

The electric conductivity of the active layer is preferably $10^{-10}$ Scm$^{-1}$ or more but less than $10^{1}$ Scm$^{-1}$, more preferably $10^{-7}$ Scm$^{-1}$ or more but less than $10^{-3}$ Scm$^{-1}$ The ratio of the electric conductivity of the active layer to the electric conductivity of the electric resistance layer (electric conductivity of active layer/electric conductivity of electric resistance layer) is preferably from $10^2$ to $10^8$.

The active layer includes preferably an amorphous oxide which contains at least In; more preferably, the amorphous oxide further contains Zn.

The electric resistance layer contains preferably an oxide or nitride of at least one metal selected from the group consisting of Ga, Al and Mg, and more preferably an oxide of at least one metal selected from the group consisting of Ga, Al and Mg.

Preferably, at least one edge portion of the active layer is covered with the electric resistance layer, and the protective layer does not contact directly with the active layer at the edge portion. More preferably, the entire active layer is covered with the electric resistance layer.

The protective layer is preferably formed by a photosensitive resin. The substrate is preferably a flexible substrate. A heat treatment (annealing) may be performed after formation of the TFT element.

The TFT of the invention is described below in more detail.

1) Amorphous Oxide Layer

Since the amorphous oxide used for the active layer in the invention can form a film at low temperatures, an amorphous oxide layer can be fabricated on a flexible resin substrate such as of plastics. Examples of the amorphous oxide which can form a film at low temperatures include an amorphous oxide containing at least one metal selected from the group consisting In, Sn, Zn and Cd, preferable examples thereof include an amorphous oxide containing at least In, and more preferable examples thereof include an amorphous oxide containing at least In and Zn.

For example, it is known that amorphous oxides having compositional structures represented by InGaO$_3$(ZnO)$_m$ (m is a natural number smaller than 6) are preferable. These amorphous oxides are n-type semiconductors, in which electrons serve as carriers. Of course, p-type oxide semiconductors such as ZnO/Rh$_2$O$_3$, CuGaO$_2$, and SrCu$_2$O$_2$ may be used for the active layer. Oxide semiconductors disclosed in JP-A No. 2006-165529 may be used.

Specifically, the amorphous oxide in the invention is preferably an amorphous oxide semiconductor which includes In—Ga—Zn—O and a composition represented by InGaO$_3$(ZnO)$_m$ (m is a natural number smaller than 6) in a crystalline state. Particularly, InGaZnO$_4$ is preferable. The amorphous oxide semiconductor of this composition has a feature that electron mobility tends to increase with an increase in electric conductivity. In addition, the electric conductivity can be regulated by regulating the partial pressure of oxygen during film formation. The active layer may include, beside an oxide semiconductor, one or more other materials such as inorganic semiconductors (such as Si and Ge), compound semiconductors (such as GaAs), organic semiconductor materials (such as pentacene and polythiophene), and carbon nanotube.

<Carrier Concentration>

The carrier concentration of the amorphous oxide layer in the invention can be adjusted to a desired value by various means.

The carrier concentration of the amorphous oxide layer in the invention is not particularly limited, and is preferably in a high carrier concentration range of $1 \times 10^{15}$ cm$^{-3}$ or more, and more preferably from $1 \times 10^{15}$ cm$^{-3}$ to $1 \times 10^{21}$ cm$^{-3}$.

As the means for adjusting the carrier concentration, the following means may be used.

(1) Adjustment by Oxygen Defect

It is known that when an oxygen vacancy occurs in an oxide semiconductor, the carrier concentration of the active layer is increased, which results in an increase in electric conductivity. Hence, the carrier concentration of an oxide semiconductor can be adjusted by regulating the quantity of oxygen vacancies. Specific methods for regulating the quantity of oxygen vacancies include regulating at least one of the partial pressure of oxygen during film formation and the oxygen concentration and treatment time of a post-treatment performed after the film formation. Examples of the post-treatment include heat treatment at a temperature of 100° C. or higher, processing with an oxygen plasma, and UV ozone treatment. Among these, the method of regulating the partial pressure of oxygen during film formation is preferable in view of productivity. The carrier concentration of an oxide semiconductor can be adjusted by regulating the partial pressure of oxygen during film formation.

(2) Adjustment by Composition Ratio

It is known that the carrier concentration of an oxide semiconductor can be changed by changing the metal composition ratio of the oxide semiconductor. For instance, in the case of $InGaZn_{1-x}Mg_xO_4$, the carrier concentration decreases with an increase in the proportion of Mg. In addition, in the oxide system represented by $(In_2O_3)_{1-x}(ZnO)_x$, the carrier concentration decreases with an increase in the proportion of Zn if the Zn/In ratio is 10% or higher. Specific examples of methods for changing the composition ratio, for example in a film formation method using sputtering, include a method using targets having different composition ratios. The composition ratio of the film can be changed alternatively by individually regulating the sputtering rate for each target when multiple targets are co-sputtered.

(3) Adjustment by Impurities

The carrier concentration can be reduced by adding one or more elements as impurities, such as Li, Na, Mn, Ni, Pd, Cu, Cd, C, N, or P, to an oxide semiconductor. Examples of methods for adding the impurities include co-vapor deposition of the oxide semiconductor and the impurity elements, and ion-doping of a pre-formed oxide semiconductor film with ions of the impurity elements.

(4) Adjustment by Oxide Semiconductor Material

While methods of adjusting the carrier concentration within the same oxide semiconductor system are described in the above items (1) to (3), the carrier concentration can be changed by changing the oxide semiconductor material. For example, it is known that the carrier concentration of $SnO_2$-based oxide semiconductors is lower than the carrier concentration of $In_2O_3$-based oxide semiconductors. Thus, the carrier concentration can be adjusted by changing the oxide semiconductor material.

As the means for adjusting the carrier concentration, any of the methods stated in the above items (1) to (4) may be used singly, or two or more of the methods stated in the above items (1) to (4) may be used in combination.

<Method of Forming Amorphous Oxide Layer>

As the methods for forming a layer of the amorphous oxide, it is suitable to adopt a vapor-phase film forming method using, as a target, a polycrystalline sintered body of an oxide semiconductor. Among vapor-phase film forming methods, sputtering method and pulsed laser deposition method (PLD method) are suitable. For mass production, sputtering method is preferable.

For instance, a film can be formed using an RF magnetron sputtering method while regulating the degree of vacuum and the flow rate of oxygen. A higher flow rate of oxygen achieves a lower electric conductivity.

It can be verified, using a conventional X-ray diffraction method, that the resultant film is an amorphous film. The composition ratio can be determined by RBS analysis (Rutherford Backscattering Spectrometry).

<Thickness of Amorphous Oxide Layer>

The thickness of the amorphous oxide layer used as the active layer in the invention is preferably from 1 nm to 100 nm, and more preferably from 2.5 nm to 50 nm.

The thickness of the amorphous oxide layer in the invention can be determined by HRTEM (High Resolution Transmission Electron Microscope) photograph of a section of the prepared TFT element.

2) Electric Resistance Layer

The electric resistance layer in the invention contains an oxide or nitride containing at least one metal selected from the group consisting of Ga, Al, Mg, Ca and Si. The electric resistance layer in the invention preferably contains an oxide or nitride of at least one metal selected from the group consisting of Ga, Al and Mg, and more preferably an oxide of at least one metal selected from the group consisting of Ga, Al and Mg.

Specific examples of the oxide (which may be an amorphous oxide) contained in the electric resistance layer according to the invention include $InGaZnO_4$, $Ga_2O_3$, $MgO$, $Al_2O_3$ and oxides formed by mixing two or more of these oxides.

The nitride for use in the invention is preferably amorphous. The nitride more preferably has an electric conductivity of from $10^{-10}$ Scm to $10^{+1}$ Scm, and still more preferably has an electric conductivity of from $10^{-7}$ Scm to $10^{-3}$ Scm. The electric resistance can be adjusted in a manner similar to the adjustment of the carrier concentration in the amorphous oxide layer described above.

The layer containing an amorphous nitride in the invention is preferably arranged so as to be adjacent to at least one of the gate electrode or the source electrode.

The layer containing an amorphous nitride in the invention preferably has a thickness of from 1 nm to 100 nm, and more preferably from 5 nm to 10 nm.

Preferably, the amorphous nitride includes at least one metal selected from the group consisting of In, Al and Ga. The amorphous nitride is more preferably an amorphous nitride containing at least Al, which even more preferably further contains In or Ga.

The amorphous nitride is described in more detail.

The amorphous nitride can be obtained by performing sputtering in argon and nitrogen, or by supplying prescribed raw materials in a prescribed quantity. For example, an amorphous nitride may be obtained by sputtering a target such as AlN, SiN, GaN or InN in argon and nitrogen. A material containing two or more compounds for forming an amorphous nitride may be used as a target.

3) Gate Electrode

According to the invention, preferable examples of a material of the gate electrode include: a metal such as Al, Mo, Cr, Ta, Ti, Au or Ag; an alloy such as Al—Nd or Ag—Pd—Cu (APC); a metal oxide electrically conductive film such as a film of tin oxide, zinc oxide, indium oxide, indium tin oxide (ITO), or indium zinc oxide (IZO); an organic electrically conductive compound such as polyaniline, polythiophene, or polypyrrole; and a mixture thereof.

The thickness of the gate electrode is preferably from 10 nm to 1000 nm, more preferably from 20 nm to 500 nm, and even more preferably from 40 nm to 100 nm.

The method of forming the gate electrode is not particularly limited. The gate electrode can be formed on the substrate according to a method which is appropriately selected, in consideration of the suitability to the material described above, from wet methods such as a printing method and a coating method, physical methods such as a vacuum deposition method, a sputtering method and an ion plating method, chemical methods such as a chemical vapor deposition (CVD) method and a plasma CVD method, and the like. For example, when ITO is selected, the gate electrode can be formed according to, for example, a direct current (DC) or high-frequency sputtering method, a vacuum deposition method, or an ion plating method. Further, when an organic electrically conductive compound is selected as the material of the gate electrode, the film formation of the gate electrode can be performed according to a wet film-forming method.

4) Gate Insulating Layer

For the gate insulating layer, an insulator such as $SiO_2$, $SiN_x$, SiON, $Al_2O_3$, $Y_2O_3$, $Ta_2O_5$, or $HfO_2$, or a mixed crystal compound containing two or more thereof may be used. Alternatively, a polymeric insulator such as polyimide may be used for the gate insulating layer.

The thickness of the gate insulating layer is preferably from 10 nm to 1000 nm, more preferably from 50 nm to 500 nm, and even more preferably from 100 nm to 200 nm. To reduce the leak current and raise the voltage resistance, the gate insulating layer should have at least a certain thickness. However, an increase in the thickness of the gate insulating layer results in a rise in the voltage needed for driving the TFT. Therefore, it is preferable that the thickness of the gate insulating layer is from 50 nm to 1000 nm when the gate insulating layer is formed of an inorganic insulator, and from 0.5 µm to 5 µm when the gate insulating layer is formed of a polymeric insulator.

Especially, use of an insulator having a high dielectric constant, such as $HfO_2$, for the gate insulating layer enables driving of the TFT at low voltage even when the gate insulating layer is thick, which is preferable.

5) Source Electrode and Drain Electrode

According to the invention, examples of materials for the source electrode and the drain electrode include: metals such as Al, Mo, Cr, Ta, Ti, Au and Ag; alloys such as Al—Nd and APC; metal oxide electrically conductive films such as films of tin oxide, zinc oxide, indium oxide, indium tin oxide (ITO) or indium zinc oxide (IZO); organic electrically conductive compounds such as polyaniline, polythiophene and polypyrrole; and mixtures thereof. In particular, IZO is preferable.

The thickness of the source electrode and the thickness of the drain electrode are each preferably from 10 nm to 1000 nm, more preferably from 20 nm to 500 nm, and even more preferably from 40 nm to 100 nm.

The method of forming the source electrode and the drain electrode is not particularly limited. The electrodes can be formed on the substrate according to a method which is appropriately selected, in consideration of the suitability to the material described above, from wet methods such as a printing method and a coating method, physical methods such as a vacuum deposition method, a sputtering method and an ion plating method, chemical methods such as a CVD method and a plasma CVD method, and the like. For example, when ITO is selected, the electrodes can be formed according to, for example, a DC or high-frequency sputtering method, a vacuum deposition method, or an ion plating method. Further, when an organic electrically conductive compound is selected as the material of the source electrode and the drain electrode, the film formation of the source electrode and drain electrode can be performed according to a wet film-forming method.

6) Protective Layer

The protective layer of the TFT in the invention is a layer for electrically separating a pixel electrode from a TFT portion.

<Material>

For the protective layer, a resin material is preferably used, such as an acrylic resin, an epoxy resin, a fluorine-containing resin, a silicon-based resin, a rubber-based resin, or an ester-based resin. The resin material is preferably a photosensitive resin or heat-curable resin, which can be patterned using a lithographic method.

<Production Method>

No particular limitation is imposed on the production method of the protective layer, and examples of the method include a method of coating a resin solution, a method of compression bonding or thermo-compression bonding a resin sheet, and a method of dry-polymerization using, for example, vapor deposition or sputtering.

<Film Thickness>

The protective layer preferably has a thickness of from 1 µm to 1 mm, more preferably from 5 µm to 100 µm, and most preferably from 10 µm to 50 µm.

7) Substrate

The substrate used in the present invention is not particularly limited, and examples thereof include: inorganic materials such as YSZ (zirconia stabilized yttrium) and glass; and organic materials such as polyesters (such as polyethylene terephthalate, polybutylene terephthalate and polyethylene naphthalate) and synthetic resins (such as polystyrene, polycarbonate, polyether sulfone, polyarylate, allyl diglycol carbonate, polyimide, polycycloolefin, norbornene resin, and poly(chlorotrifluoroethylene)). The organic materials described above are preferably excellent in heat resistance, stability of dimension, resistance to solvents, electric insulating property, workability, low gas permeability, low hygroscopicity, and the like.

According to the invention, it is particularly preferable to use a flexible substrate. As the material used for the flexible substrate, an organic plastic film which has high transmittance is preferable, and examples thereof include: polyesters such as polyethylene terephthalate, polybutylene phthalate and polyethylene naphthalate; and plastic films such as of polystyrene, polycarbonate, polyether sulfone, polyarylate, polyimide, polycycloolefin, norbornene resin, or polychlorotrifluoroethylene. Such a film-shaped plastic substrate is preferably provided with one or more additional layers such as an insulating layer (if the insulation is insufficient), a gas-barrier layer for preventing penetration of moisture and oxygen through the substrate, or an undercoat layer for enhancing the planarity of the film-shaped plastic substrate and/or improving adhesiveness of the film-shaped plastic substrate to the electrodes and the insulating layer.

The thickness of the flexible substrate is preferably from 50 µm to 500 µm. This is because, when the thickness of the flexible substrate is less than 50 µm, it is hard for the substrate to maintain sufficient planarity itself, whereas when the flexible substrate is thicker than 500 µm, it is difficult to bend the substrate itself freely, i.e., the flexibility of the substrate is insufficient.

8) Structure

Next, the structure of the TFT of the invention is described in detail with reference to the drawings.

FIG. 1 is a schematic view showing one example of the TFT of the invention. When an insulating substrate 1 is a flexible substrate such as a plastic film, an insulating layer is disposed on at least one surface of the flexible substrate. On the insulating substrate 1, a gate electrode 2, a gate insulating layer 3, an active layer 4, and an electric resistance layer 7 are superposed, and, on the surface of the electric resistance layer 7, a source electrode 5-1 and a drain electrode 5-2 are disposed. Furthermore, the surface of the electric resistance layer, except the portions corresponding to the terminals in contact with the source electrode and the drain electrode respectively, is covered with a protective layer 6.

Figure 2:
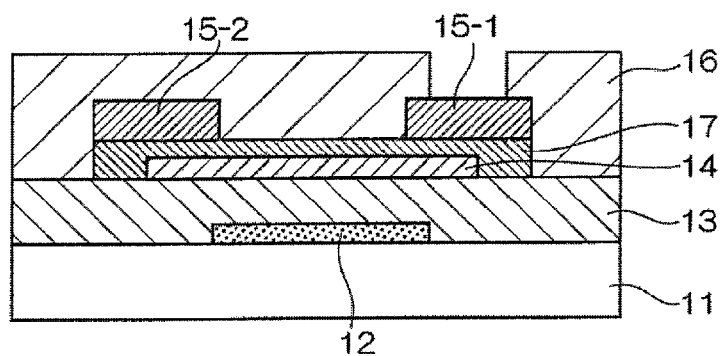
FIG. 2 is a schematic diagram showing another TFT element structure according to the invention.

FIG. 2 is a schematic view showing another example of the TFT of the invention. When an insulating substrate 11 is a flexible substrate such as a plastic film, an insulating layer is disposed on at least one surface of the flexible substrate. On the insulating substrate 11, a gate electrode 12, a gate insulating layer 13, an active layer 14 are superposed. An electric resistance layer 17 is disposed so as to entirely cover the upper surface and edge portions of the active layer 14, and a source electrode 15-1 and a drain electrode 15-2 are disposed on the surface of the electric resistance layer 17. According to this configuration, since the upper surface and the edge portion of the active layer 14 are protected by the electric resistance layer 17, the active layer 14 does not contact directly with the protective layer 16. Further, since the electric resistance layer 17 has chemical resistance, patterning of the source electrode 15-1 and the drain electrode 15-2 can be easily performed using a chemical etching method. For example, after uniformly forming a metal film for the source electrode or a metal film for the drain electrode on the electric resistance layer 17 using vapor deposition, a generally-known photoresist film may coated and patterned, which may be then subjected to an etching treatment with an acidic etching liquid, thereby patterning the source electrode 15-1 or the drain electrode 15-2. In FIG. 2, protective layer is represented by reference numeral 16.

Figure 3:
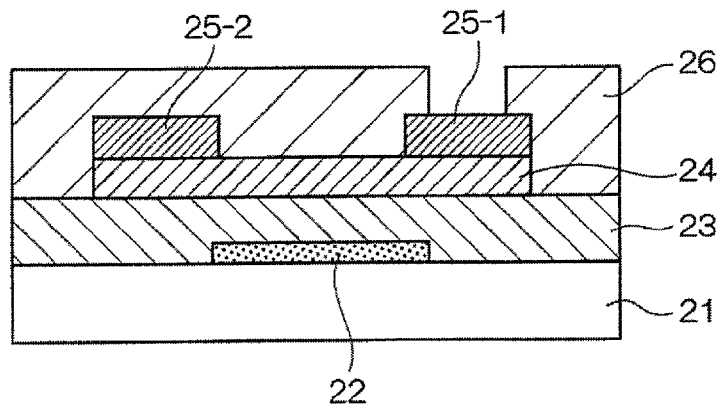
FIG. 3 is a schematic diagram showing a conventional TFT element structure.

FIG. 3 is a schematic view showing an example of a conventional TFT. A gate electrode 22, a gate insulating layer 23 and an active layer 24 are superposed on an insulating substrate 21, and, on the surface of the active layer 24, a source electrode 25-1 and a drain electrode 25-2 are disposed. In this configuration, since a protective layer 26 contacts with the active layer 24, the TFT performance is deteriorated. When the active layer 24 is an amorphous oxide layer, since the amorphous oxide layer does not have resistance to a chemical etching liquid, a resist method cannot be utilized for providing the source electrode 25-1 or the drain electrode 25-2; instead, formation of the source electrode 25-1 or the drain electrode 25-2 requires vapor deposition with a shadow mask sheet superposed on the active layer 24 for shielding portions at which the source electrode 25-1 or the drain electrode 25-2 need not be formed. High-definition patterning is hard to achieve with such a process.

Figure 4:
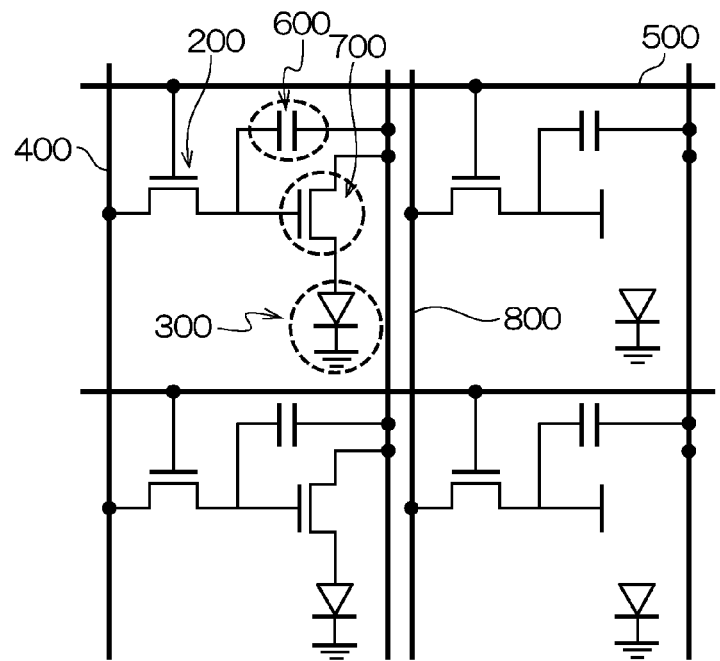
FIG. 4 is a schematic diagram of an equivalent circuit of an active matrix-driving type organic EL display using a TFT element according to the invention.
Figure 5:
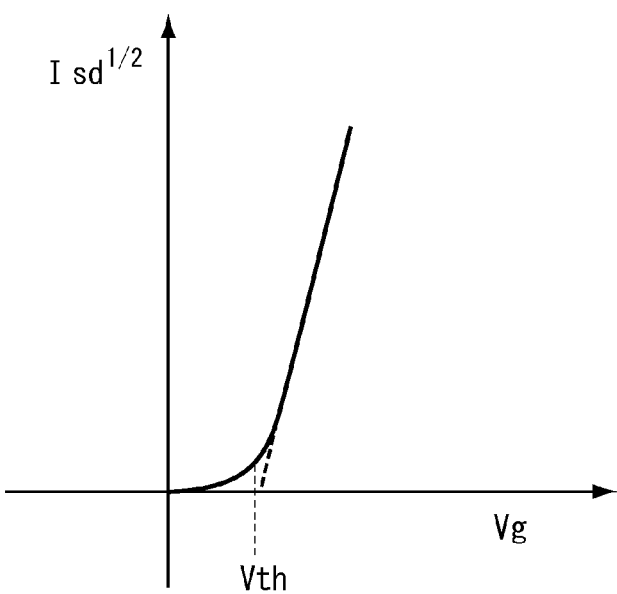
FIG. 5 is a schematic view of a graph showing how to determine a threshold voltage (Vth) of a TFT in an evaluation of performance. The horizontal axis represents a gate voltage (Vg), and the vertical axis represents a square root of Isd (current flowing between a source electrode and a drain electrode) ($Isd^{1/2}$).

FIG. 4 is a schematic diagram of an equivalent circuit of an active matrix type organic EL display in which the TFT of the invention is used. In FIG. 4, an organic EL element 300, a driver TFT 700, a switching TFT 200, and a capacitor 600 are wired with a scanning wire 500, signal wire 400, and common wire 800. The circuit of the display according to the invention is not particularly limited to that shown in FIG. 4. A circuit which is conventionally known in the art may be applied as it is.

2. Display

The thin film field effect transistor of the invention is preferably used for an image display with a liquid crystal or EL element incorporated therein, and particularly for a flat panel display (FPD). The thin film field effect transistor of the invention is more preferably used for a flexible display in which a flexible substrate, such as an organic plastic film, is used as a substrate. In particular, the thin film field effect transistor of the invention has high mobility, and therefore is most preferably used for a display including an organic EL element or a flexible organic EL display.

(Organic EL Display)

The organic EL display of the invention may have a configuration that includes: an organic EL element including a substrate and, on the substrate, at least a lower electrode, an organic compound layer including at least a light-emitting layer, and an upper electrode in this order; and a TFT for driving the organic EL element, the TFT including, on the above upper electrode, at least a gate electrode, a gate insulating layer, an active layer containing an oxide semiconductor, an electric resistance layer, a source electrode and a drain electrode, and a protective layer in this order from the upper electrode side in the thickness direction. Since the TFT is disposed at the backside of the organic EL element, an aperture for extracting light emitted from the organic EL element can be increased. Preferably, a protective insulating layer is disposed between the TFT and the organic EL element, and the upper electrode of the organic EL element and the source electrode or drain electrode of the TFT are electrically connected to each other via a contact hole formed in the protective insulating layer. Preferably, the lower electrode is a light-transmitting electrode and the upper electrode is a light-reflective electrode.

The organic EL display may, for example, have a configuration that includes: a TFT including, on an insulating substrate, a gate electrode, a gate insulating layer, an active layer containing an oxide semiconductor, an electric resistance layer, a source electrode and a drain electrode, and a protective layer in this order in the thickness direction; and an organic EL element disposed at the upper side of the TFT and including a lower electrode, an organic compound layer including a light-emitting layer, and an upper electrode in this order from the TFT side in the thickness direction, wherein the organic EL element is driven by the TFT. Either of the lower electrode or the upper electrode in this organic EL element may be a light-transmitting electrode.

Hereinafter, the organic EL element according to the invention is described in detail.

The light-emitting element according to the invention includes a substrate, a cathode and an anode provided on the substrate, and an organic compound layer including an organic light-emitting layer (hereinafter, sometimes simply referred to as a "light-emitting layer") between the two electrodes. Due to the nature of a light-emitting element, it is preferred that at least one of the electrodes (at least one of the anode or the cathode) is transparent.

Regarding the layer configuration of the organic compound layer according to the present invention, it is preferred that the organic compound layer includes a hole transport layer, a light-emitting layer, and an electron transport layer disposed one on another in this order from the anode side. Moreover, a hole injection layer may be provided between the hole transport layer and the anode, and an electron transporting intermediate layer may be provided between the light-emitting layer and the electron transport layer.

In addition, a hole transporting intermediate layer may be provided between the light-emitting layer and the hole transport layer, and similarly, an electron injection layer may be provided between the cathode and the electron transport layer.

Further, each of the layers may be composed of plural secondary layers.

The respective layers constituting the organic compound layer can be suitably formed using any of the following: a dry film-forming method such as a vapor deposition method or a sputtering method; a transfer method; a printing method; a coating method; an ink-jet method; a spray method; or the like.

Next, the components constituting the organic EL element according to the present invention will be described in detail.

(Substrate)

The substrate to be used in the invention is preferably a substrate which does not scatter or attenuate light emitted from the organic compound layer. Specific examples of the substrate material include inorganic materials such as zirconia-stabilized yttrium (YSZ) and glass; organic materials such as polyesters (for example, polyethylene terephthalate, polybutylene phthalate, and polyethylene naphthalate), polystyrene, polycarbonate, polyethersulfone, polyarylate, polyimide, polycycloolefin, norbornene resin, and poly(chlorotrifluoroethylene).

For instance, when glass is used as the substrate, the material thereof is preferably non-alkali glass in order to decrease ions eluted from the glass. When soda-lime glass is used, the soda-lime glass has preferably been barrier-coated with, for example, silica. When an organic material is used, the organic material is preferably a material excellent in heat resistance, dimensional stability, solvent resistance, electric insulating property, and workability.

The shape, structure, size or the like of the substrate are not particularly limited, and may be suitably selected according to the application, purpose and the like of the light-emitting element. In general, a plate-shaped substrate is preferred as the shape of the substrate. The structure of the substrate may be a monolayer structure or a laminated structure. Furthermore, the substrate may be formed from a single member or two or more members.

The substrate may be transparent and colorless, or transparent and colored. The substrate is preferably transparent and colorless from the viewpoint that the substrate does not scatter or attenuate light emitted from the organic light-emitting layer.

A moisture permeation preventive layer (gas barrier layer) may be provided on the front or back surface of the substrate.

Suitable examples of the material of the moisture permeation preventive layer (gas barrier layer) include inorganic substances such as silicon nitride and silicon oxide. The moisture permeation preventive layer (gas barrier layer) may be formed using, for example, a high-frequency sputtering method.

When a thermoplastic substrate is used, a hard-coat layer or an undercoat layer may be further provided as needed.

(Anode)

The anode may generally be any material as long as it has a function as an electrode that supplies holes to the organic compound layer, and there is no particular limitation as to the shape, structure, size or the like thereof. However, the anode material may be suitably selected from known electrode materials according to the application and purpose of the light-emitting element. As mentioned above, the anode is usually provided as a transparent anode.

Preferable examples of the anode material include metals, alloys, metal oxides, electrically conductive compounds, and mixtures thereof. Specific examples of the anode material include electrically conductive metal oxides such as tin oxides doped with antimony, fluorine or the like (ATO, FTO, or the like), tin oxide, zinc oxide, indium oxide, indium tin oxide (ITO), and indium zinc oxide (IZO); metals such as gold, silver, chromium, and nickel; mixtures or laminates of at least one of these metals and at least one of the electrically conductive metal oxides; inorganic electrically conductive materials such as copper iodide and copper sulfide; organic electrically conductive materials such as polyaniline, polythiophene, and polypyrrole; and laminates of these anode materials with ITO. Among these, electrically conductive metal oxides are preferred, and particularly, ITO is preferable in view of productivity, high electric conductivity, transparency and the like.

The anode may be formed on the substrate, using a method which is appropriately selected, in consideration of the suitability to the material constituting the anode, from wet methods such as a printing method and a coating method; physical methods such as a vacuum deposition method, a sputtering method, and an ion plating method; and chemical methods such as a CVD method and plasma CVD method. For instance, when ITO is selected as a material for the anode, the anode may be formed using a DC or high-frequency sputtering method, a vacuum deposition method, an ion plating method or the like.

In the organic electroluminescence element according to the present invention, the location of the anode is not particularly limited, and may be suitably selected according to the application and purpose of the light-emitting element. The anode is preferably formed on the substrate. In this case, the anode may be formed on an entire one surface of the substrate or a part of one surface of the substrate.

The patterning for forming the anode may be performed using a chemical etching method such as photolithography, a physical etching method such as etching using a laser, a method of vacuum deposition or sputtering using a superposed mask, a lift-off method, or a printing method.

The thickness of the anode may be suitably selected according to the material constituting the anode, and is therefore not specified uniquely. The thickness of the anode is usually in a range of from 10 nm to 50 µm, and preferably from 50 nm to 20 µm.

The electric resistance of the anode is preferably $10^3$ Ω/sq or less, and more preferably $10^2$ Ω/sq or less. When the anode is transparent, the anode may be either transparent and colorless, or transparent and colored. For extracting luminescence from the transparent anode side, the light transmittance of the anode is preferably 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, (C.M.C., (1999)), the contents of which are incorporated by reference herein. When a plastic substrate having low heat resistance is used, it is preferable to form a transparent anode using ITO or IZO at a low temperature of 150° C. or lower.

(Cathode)

The cathode may generally be any material as long as it has a function as an electrode that injects electrons into the organic compound layer, and there is no particular limitation as to the shape, structure, size or the like of the cathode. However the cathode may be suitably selected from known electrode materials according to the application and purpose of the light-emitting element.

Examples of the cathode material include metals, alloys, metal oxides, electrically conductive compounds, and mixtures thereof. Specific examples thereof include alkali metals (such as Li, Na, K, and Cs), alkaline earth metals (such as Mg and Ca), gold, silver, lead, aluminum, sodium-potassium alloys, lithium-aluminum alloys, magnesium-silver alloys, and rare earth metals such as indium and ytterbium. Although any of these materials may be used singly, it is preferable, from the viewpoint of satisfying both stability and electron injection properties, to use two or more thereof in combination.

Among these, as the material for constituting the cathode, alkaline metals or alkaline earth metals are preferred in view of electron injection properties, and materials containing aluminum as a major component are preferred in that such materials have excellent preservation stability.

The term "material containing aluminum as a major component" refers to any of a material formed by aluminum alone; an alloy of aluminum and 0.01% by weight to 10% by weight of an alkaline metal or an alkaline earth metal; or a mixture thereof (e.g., a lithium-aluminum alloy, a magnesium-aluminum alloy or the like).

Materials for the cathode are described in detail in JP-A Nos. 2-15595 and 5-121172, and the materials described in these documents are applicable in the present invention.

The method for forming the cathode is not particularly limited, and the cathode may be formed using a known method.

For instance, the cathode may be formed, using a method which is appropriately selected, in consideration of the suitability to the material constituting the cathode, from wet methods such as a printing method and a coating method; physical methods such as a vacuum deposition method, a sputtering method, and an ion plating method; and chemical methods such as a CVD method and a plasma CVD method. For example, when a metal or metals are selected as the cathode material, the cathode may be formed by depositing one kind thereof using a sputtering method or the like, or by depositing two or more kinds thereof, simultaneously or sequentially, using a sputtering method or the like.

The patterning for forming the cathode may be performed using a chemical etching method such as photolithography, a physical etching method such as etching using a laser, a method of vacuum deposition or sputtering using a superposed mask, a lift-off method, or a printing method.

In the present invention, the location of the cathode is not particularly limited. The cathode may be formed on an entire one surface of the organic compound layer or a part of one surface of the organic compound layer.

Furthermore, a dielectric material layer having a thickness of from 0.1 nm to 5 nm and made of a fluoride, oxide or the like of an alkaline metal or alkaline earth metal may be disposed between the cathode and the organic compound layer. The dielectric material layer may be considered as a kind of electron injection layer. The dielectric material layer may be formed using, for example, a vacuum deposition method, a sputtering method, an ion-plating method or the like.

The thickness of the cathode may be suitably selected according to the material constituting the cathode and is therefore not specified uniquely. The thickness of the cathode is usually in a range of from 10 nm to 5 μm, and preferably from 50 nm to 1 μm.

Moreover, the cathode may be transparent or opaque. The transparent cathode may be formed by depositing a material for the cathode to a small thickness of 1 nm to 10 nm, and further depositing thereon a transparent electrically conductive material such as ITO or IZO.

(Organic Compound Layer)

The organic compound layer according to the present invention is described below.

The organic EL element according to the present invention has an organic compound layer having at least one layer including a light-emitting layer. Examples of (organic compound) layers in the organic compound layer, other than the light-emitting layer, include a hole transport layer, an electron transport layer, an electric charge blocking layer, a hole injection layer, an electron injection layer and the like as described above.

In the organic EL element according to the present invention, the respective layers constituting the organic compound layer can be suitably formed using, for example, any of a dry film-forming method such as a vapor deposition method or a sputtering method; a wet film-forming method; a transfer method; a printing method; or an ink-jet method.

(Light-Emitting Layer)

The organic light-emitting layer is a layer that, when an electric field is applied, performs functions of receiving holes from the anode, a hole injection layer, or a hole transport layer, and receiving electrons from the cathode, an electron injection layer, or an electron transport layer, and providing a place for the recombination of the holes and the electrons to emit light.

The light-emitting layer according to the present invention may be formed of a light-emitting material only, or may be a mixture layer containing a host material and a light-emitting dopant. The light-emitting dopant may be a fluorescent light-emitting material or a phosphorescent light-emitting material, and may include plural kinds of light-emitting material. The host material is preferably an electric charge-transporting material. The host material may include one kind of host material only, or may include plural kinds of host material. For example, the host material may be a mixture of a hole-transporting host material and an electron-transporting host material. Further, the light-transmitting layer may include a material that does not emit light and that does not have charge transporting property.

The light-emitting layer may be a single layer or may include plural layers, in which case the respective layers may emit light having different colors from each other.

In the present invention, any of a fluorescent light-emitting material or a phosphorescent light-emitting material may be used as a light-emitting dopant.

The light-emitting layer according to the present invention may contain two or more light-emitting dopants, with a view to improving color purity and broadening the wavelength region of emitted light. It is preferred, from the viewpoint of driving durability, that the light-emitting dopant in the present invention is a dopant satisfying at least one of following relationships (i) and (ii) between the host material and the light-emitting dopant:

(i) 1.2 eV>the difference in Ip between host material and light-emitting dopant ($\Delta$Ip)>0.2 eV (ii) 1.2 eV>the difference in Ea between host material and light-emitting dopant ($\Delta$Ea)>0.2 eV.

<<Phosphorescent Light-Emitting Dopant>>

Examples of the phosphorescent light-emitting dopant generally include complexes containing a transition metal atom or a lanthanoid atom.

The transition metal atom is not particularly limited. For instance, the transition metal atom is preferably ruthenium, rhodium, palladium, tungsten, rhenium, osmium, iridium, gold, silver, copper or platinum, more preferably rhenium, iridium, or platinum, and even more preferably iridium or platinum.

Examples of the lanthanoid atom include lanthanum, cerium, praseodymium, neodymium, samarium, europium, gadolinium, terbium, dysprosium, holmium, erbium, thulium, ytterbium, and lutetium. Among these lanthanoid atoms, neodymium, europium, and gadolinium are preferred.

Examples of ligands in the complex include the ligands described, for example, in "Comprehensive Coordination Chemistry" authored by G. Wilkinson et al. (Pergamon Press Company (1987)); "Photochemistry and Photophysics of Coordination Compounds" authored by H. Yersin (Springer-Verlag Company (1987)); and "YUHKI KINZOKU KAGAKU-KISO TO OUYOU—(Organometallic Chemistry—Fundamental and Application—)" authored by Akio Yamamoto (Shokabo Publishing Co., Ltd. (1982)).

Regarding specific examples of the ligand, preferable examples thereof include a halogen ligand (preferably a chlorine ligand), an aromatic carbocyclic ligand (for example, an aromatic carbocyclic ligand having preferably 5 to 30 carbon atoms, more preferably 6 to 30 carbon atoms, even more preferably 6 to 20 carbon atoms, and particularly preferably 6 to 12 carbon atoms, such as a cyclopentadienyl anion, a benzene anion, or a naphthyl anion), a nitrogen-containing heterocyclic ligand (for example, a nitrogen-containing heterocyclic ligand having preferably 5 to 30 atoms, more preferably 6 to 30 carbon atoms, even more preferably 6 to 20 carbon atoms, and particularly preferably 6 to 12 carbon atoms, such as phenylpyridine, benzoquinoline, quinolinol, bipyridyl, or phenanthroline), a diketone ligand (for example, acetylacetone), a carboxylic acid ligand (for example, a carboxylic acid ligand having preferably 2 to 30 carbon atoms, more preferably 2 to 20 carbon atoms, and even more preferably 2 to 16 carbon atoms, such as acetic acid ligand), an alcoholato ligand (for example, an alcoholato ligand having preferably 1 to 30 carbon atoms, more preferably 1 to 20 carbon atoms, and even more preferably 6 to 20 carbon atoms, such as phenolato ligand), a silyloxy ligand (for example, a silyloxy ligand having preferably 3 to 40 carbon atoms, more preferably 3 to 30 carbon atoms, and even more preferably 3 to 20 carbon atoms, such as a trimethylsilyloxy ligand, a dimethyl-tert-butylsilyloxy ligand, or a triphenylsilyloxy ligand), a carbon monoxide ligand, an isonitrile ligand, a cyano ligand, a phosphorus ligand (having preferably 3 to 40 carbon atoms, more preferably 3 to 30 carbon atoms, even more preferably 3 to 20 carbon atoms, and particularly preferably 6 to 20 carbon atoms, such as triphenylphosphine ligand), a thiolato ligand (having preferably 1 to 30 carbon atoms, more preferably 1 to 20 carbon atoms, and even more preferably 6 to 20 carbon atoms, such as a phenylthiolato ligand), and a phosphine oxide ligand (having preferably 3 to 30 carbon atoms, more preferably 8 to 30 carbon atoms, and even more preferably 18 to 30 carbon atoms, such as a triphenylphosphine oxide ligand), and more preferably a nitrogen-containing heterocyclic ligand.

The above-described complex may be either a complex containing only one transition metal atom therein, or a so-called polynuclear complex containing two or more transition metal atoms therein, in which case the two or more transition metal atoms may be the same as each other or different from each other.

Among these, specific examples of the light-emitting dopant include phosphorescent light-emitting compounds described in patent documents such as U.S. Pat. Nos. 6,303,238B1 and 6,097,147; International Patent Publication (WO) Nos. 00/57676, 00/70655, 01/08230, 01/39234A2, 01/41512A1, 02/02714A2, 02/15645A1, 02/44189A1, and 05/19373A2; JP-A Nos. 2001-247859, 2002-302671, 2002-117978, 2002-235076, 2003-123982, and 2002-170684; EP 1211257; JP-A Nos. 2002-226495, 2002-234894, 2001-247859, 2001-298470, 2002-173674, 2002-203678, 2002-203679, 2004-357791, 2006-256999, 2007-19462, 2007-84635, and 2007-96259. Among these, more preferable examples of the light-emitting dopant include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes.

Particularly preferable are Ir complexes, Pt complexes, and Re complexes; and among these, Ir complexes, Pt complexes, and Re complexes each containing at least one coordination mode selected from a metal-carbon bond, a metal-nitrogen bond, a metal-oxygen bond, and a metal-sulfur bond are preferred. Ir complexes, Pt complexes, and Re complexes each containing a tri- or higher-dentate ligand are particularly preferred in view of light-emission efficiency, driving durability, color purity and the like.

<<Fluorescent Light-Emitting Dopant>>

Examples of the above-described fluorescent light-emitting dopant generally include benzoxazole, benzimidazole, benzothiazole, styrylbenzene, polyphenyl, diphenylbutadiene, tetraphenylbutadiene, naphthalimide, coumarin, pyran, perinone, oxadiazole, aldazine, pyrazine, cyclopentadiene, bis-styrylanthracene, quinacridone, pyrrolopyridine, thiadiazolopyridine, cyclopentadiene, styrylamine, aromatic dimethylidine compounds, condensed polycyclic aromatic compounds (such as anthracene, phenanthroline, pyrene, perylene, rubrene, and pentacene), a variety of metal complexes, typical examples of which include metal complexes of 8-quinolinol, pyromethene complexes and rare-earth complexes, polymer compounds such as polythiophene, polyphenylene and polyphenylenevinylene, organic silanes, and derivatives thereof.

Among these, specific examples of the light-emitting dopant include the following compounds, but it should be noted that the present invention is not limited thereto.

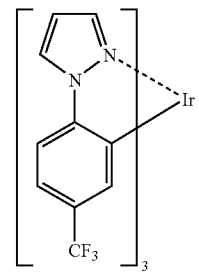

D-1

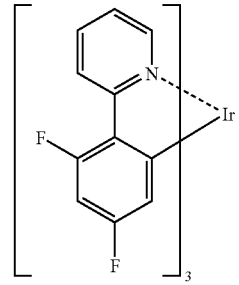

D-2

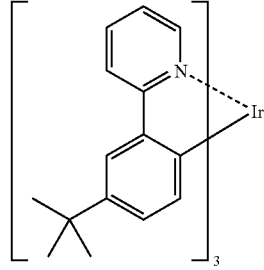

D-3

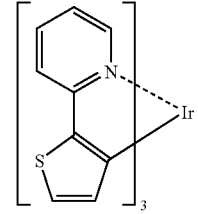

D-4

-continued
D-5
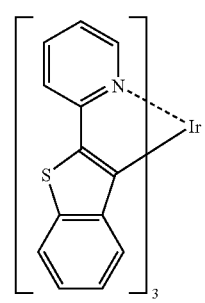
D-6
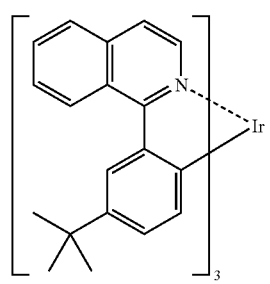
D-7
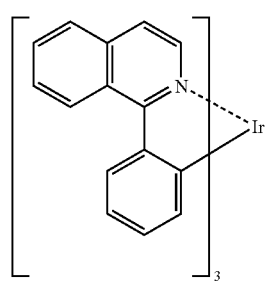
D-8
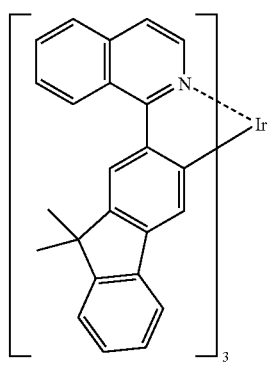
D-9
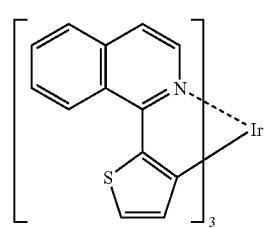
-continued
D-10
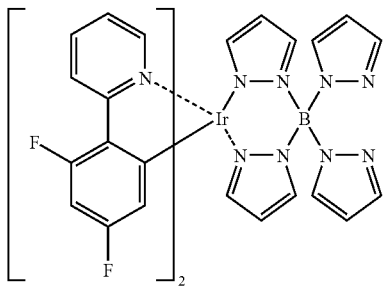
D-11
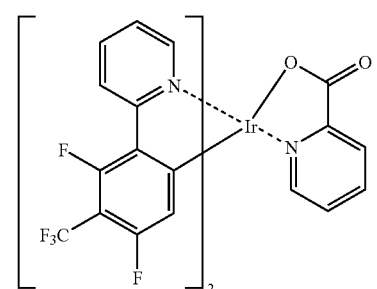
D-12
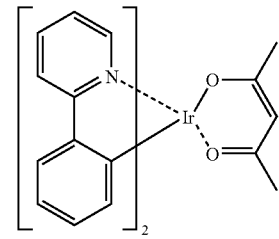
D-13
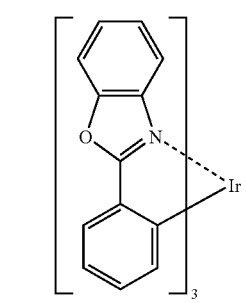
D-14
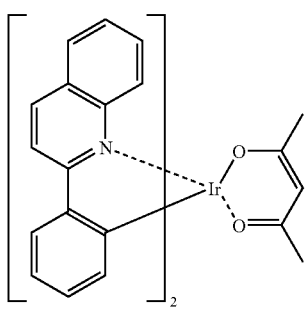

-continued
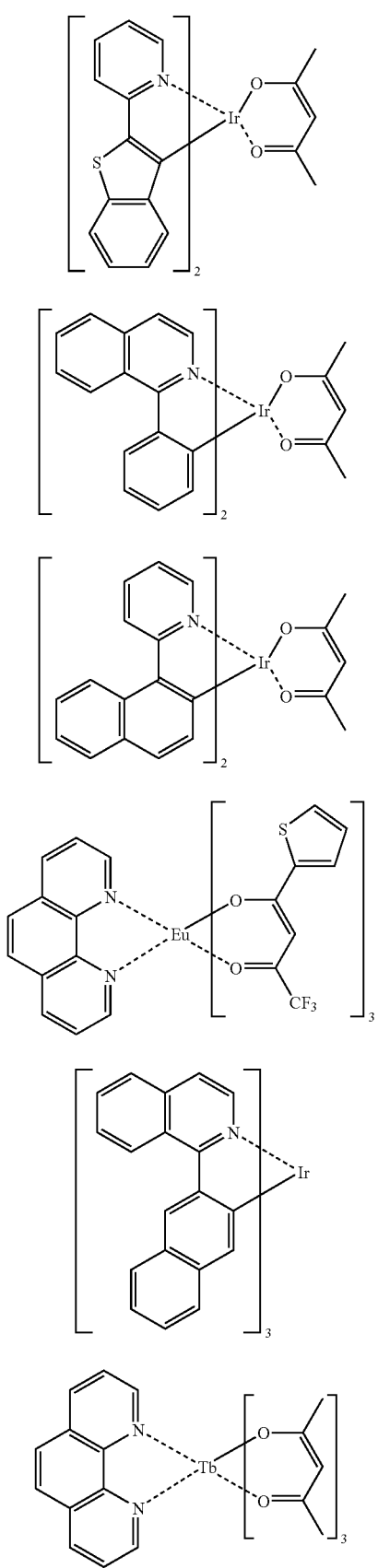
D-15
D-16
D-17
D-18
D-19
D-20
-continued
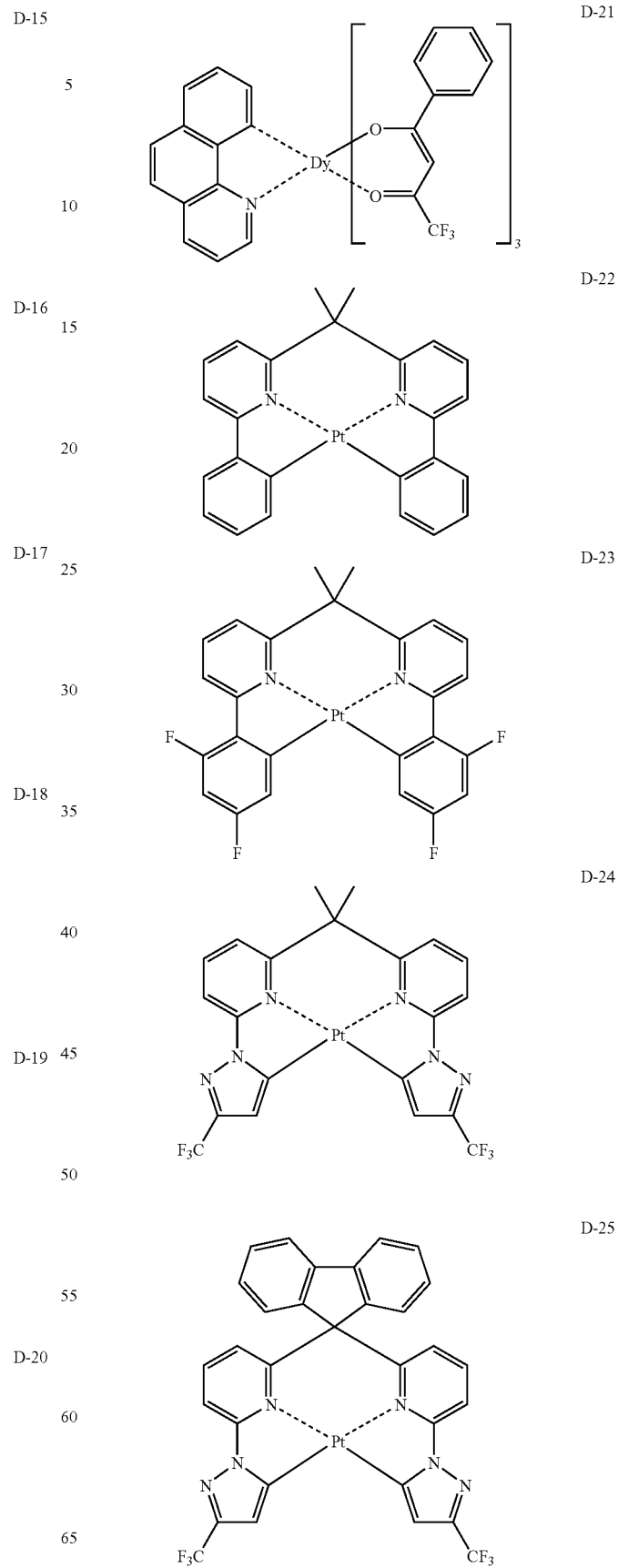
D-21
D-22
D-23
D-24
D-25

-continued
D-26
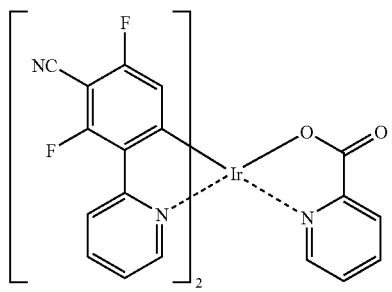
D-27
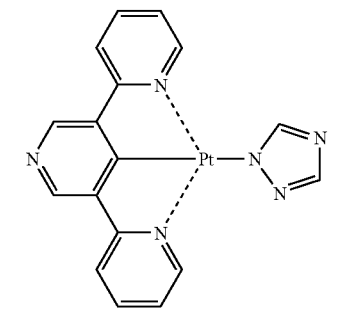
D-28
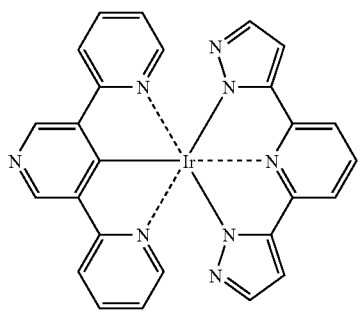
D-29
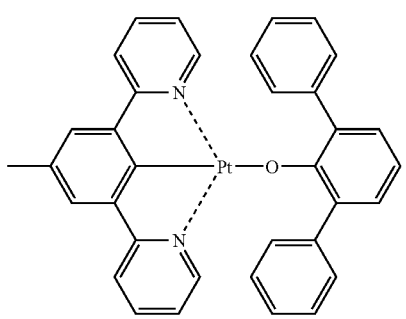
D-30
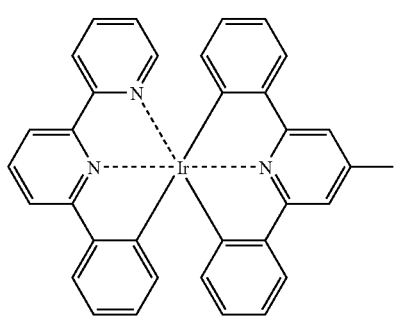
-continued
D-31
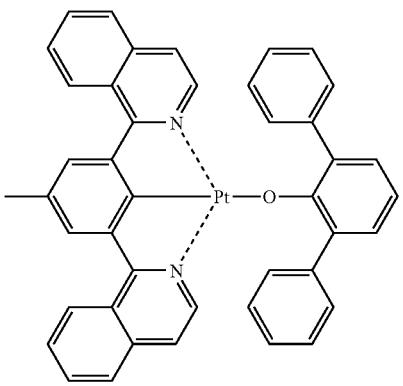
D-32
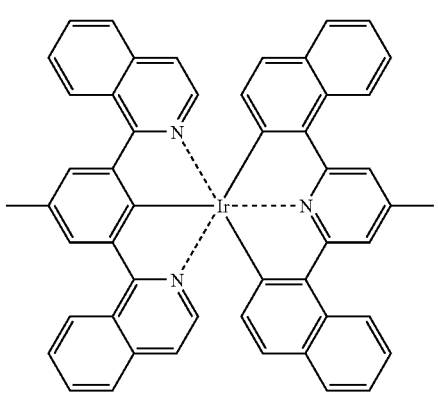
D-33
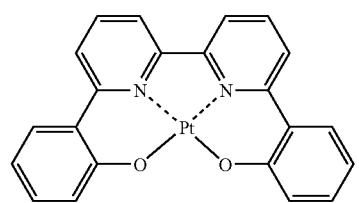
D-34
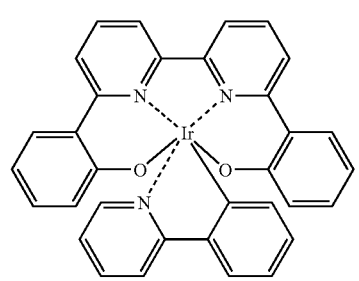
D-35
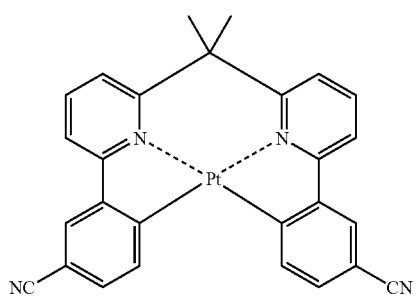

D-36
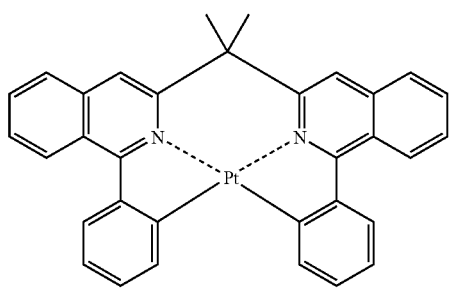
D-37
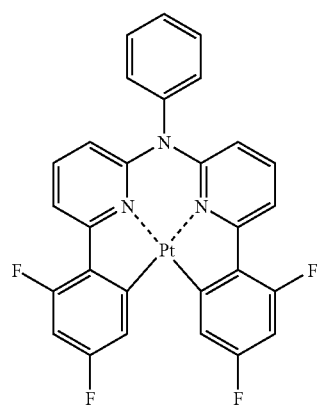
D-38
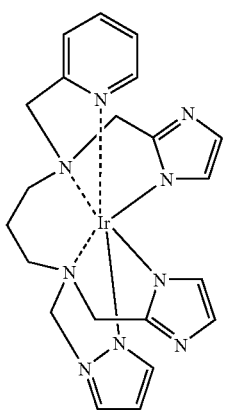
D-39
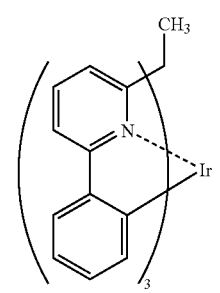
D-40
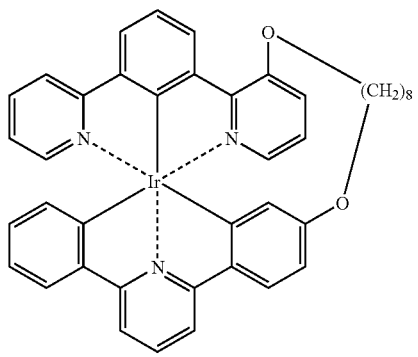
D-41
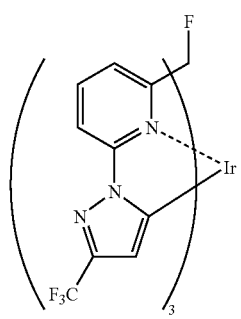
D-42
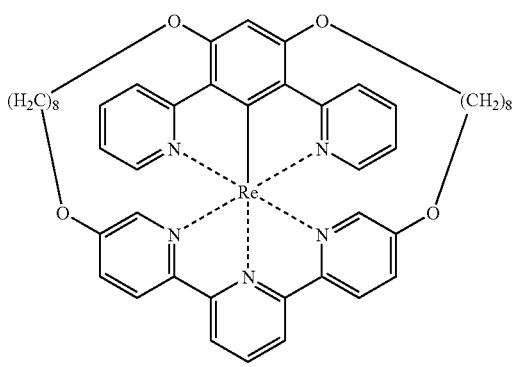
D-43
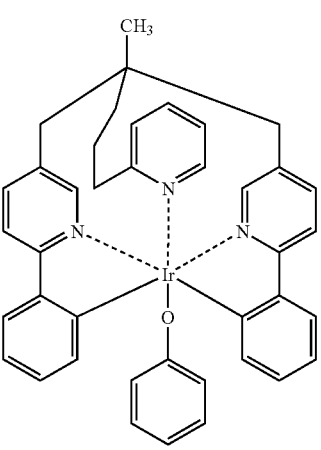
The content of the light-emitting dopant in the light-emitting layer is generally from 0.1% by weight to 50% by weight with respect to the total weight of the compounds forming the light-emitting layer, and the content of the light-emitting dopant in the light-emitting layer is preferably from 1% by weight to 50% by weight, and more preferably from 2% by weight to 40% by weight, with respect to the total weight of the compounds forming the light-emitting layer, in view of driving durability and external quantum efficiency.

Although the thickness of the light-emitting layer is not particularly limited, a thickness of from 2 nm to 500 nm is usually preferred, and, particularly, a thickness of from 3 nm to 200 nm is more preferred, and a thickness of from 5 nm to 100 nm is even more preferred, in view of external quantum efficiency.

<Host Material>

As the host materials to be used in the present invention, a hole-transporting host material excellent in hole transporting property (referred to as a "hole-transporting host" in some cases) and an electron-transporting host compound excellent in electron-transporting property (referred to as an "electron-transporting host" in some cases) may be used.

<<Hole-Transporting Host>>

Specific examples of the hole-transporting host used in the present invention include pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electrically conductive high-molecular oligomers such as thiophene oligomers and polythiophene, organic silanes, carbon films, and derivatives thereof.

Among these, indole derivatives, carbazole derivatives, aromatic tertiary amine compounds, and thiophene derivatives are preferable, and compounds containing a carbazole group in a molecule thereof are more preferable. Particularly, compounds containing a t-butyl-substituted carbazole group are preferred.

<<Electron-Transporting Host>>

The electron affinity Ea of the electron-transporting host included in the light-emitting layer in the present invention is preferably from 2.5 eV to 3.5 eV, more preferably from 2.6 eV to 3.4 eV, and even more preferably from 2.8 eV to 3.3 eV, in view of improvement in durability and decrease in driving voltage. The ionization potential Ip of the electron-transporting host is preferably from 5.7 eV to 7.5 eV, more preferably from 5.8 eV to 7.0 eV, and even more preferably from 5.9 eV to 6.5 eV, in view of improvement in driving durability and decrease in driving voltage.

Specific examples of such an electron-transporting host include pyridine, pyrimidine, triazine, imidazole, pyrazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, aromatic ring tetracarboxylic anhydrides such as naphthalenetetracarboxylic anhydride and perylenetetracarboxylic anhydride, phthalocyanine, derivatives thereof (which may form a condensed ring with another ring), and a variety of metal complexes, typical examples of which include metal complexes of 8-quinolinol derivatives, metal phthalocyanines, and metal complexes having benzoxazole or benzothiazole as a ligand.

Preferable examples of the electron-transporting host include metal complexes, azole derivatives (such as benzimidazole derivatives and imidazopyridine derivatives), and azine derivatives (such as pyridine derivatives, pyrimidine derivatives, and triazine derivatives). Among these, metal complex compounds are preferred in the present invention in view of durability. As the metal complex compound, a metal complex containing a ligand having at least one nitrogen, oxygen, or sulfur atom coordinated to the metal is more preferable.

The metal ion in the metal complex is not particularly limited, and is preferably a beryllium ion, a magnesium ion, an aluminum ion, a gallium ion, a zinc ion, an indium ion, a tin ion, a platinum ion, or a palladium ion, more preferably a beryllium ion, an aluminum ion, a gallium ion, a zinc ion, a platinum ion, or a palladium ion, and even more preferably an aluminum ion, a zinc ion, or a palladium ion.

Examples of a ligand contained in the above metal complex include a variety of known ligands. Examples thereof include ligands described in "Photochemistry and Photophysics of Coordination Compounds" authored by H. Yersin (Springer-Verlag Company (1987)) and "YUHK IKINZOKU KAGAKU-KISO TO OUYOU—(Organometallic Chemistry—Fundamental and Application—)" authored by Akio Yamamoto (Shokabo Publishing Co., Ltd. (1982)).

The ligand is preferably a nitrogen-containing heterocyclic ligand (having preferably 1 to 30 carbon atoms, more preferably 2 to 20 carbon atoms, and particularly preferably 3 to 15 carbon atoms), and may be a monodentate ligand or a bi- or higher-dentate ligand. The ligand is preferably a bi- to hexa-dentate ligand, or a mixed ligand of a bi- to hexa-dentate ligand and a monodentate ligand.

Examples of the ligand include azine ligands (e.g. pyridine ligands, bipyridyl ligands, and terpyridine ligands); hydroxyphenylazole ligands (e.g. hydroxyphenylbenzimidazole ligands, hydroxyphenylbenzoxazole ligands, hydroxyphenylimidazole ligands, and hydroxyphenylimidazopyridine ligands); alkoxy ligands (having preferably 1 to 30 carbon atoms, more preferably 1 to 20 carbon atoms, and particularly preferably 1 to 10 carbon atoms, examples of which include methoxy, ethoxy, butoxy, and 2-ethylhexyloxy); aryloxy ligands (having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, and 4-biphenyloxy);

heteroaryloxy ligands (having preferably 1 to 30 carbon atoms, more preferably 1 to 20 carbon atoms, and particularly preferably 1 to 12 carbon atoms, examples of which include pyridyloxy, pyrazinyloxy, pyrimidyloxy, and quinolyloxy); alkylthio ligands (having preferably 1 to 30 carbon atoms, more preferably 1 to 20 carbon atoms, and particularly preferably 1 to 12 carbon atoms, examples of which include methylthio and ethylthio); arylthio ligands (having preferably 6 to 30 carbon atoms, more preferably 6 to 20 carbon atoms, and particularly preferably 6 to 12 carbon atoms, examples of which include phenylthio); heteroarylthio ligands (having preferably 1 to 30 carbon atoms, more preferably 1 to 20 carbon atoms, and particularly preferably 1 to 12 carbon atoms, examples of which include pyridylthio, 2-benzimidazolylthio, 2-benzoxazolylthio, and 2-benzothiazolylthio); siloxy ligands (having preferably 1 to 30 carbon atoms, more preferably 3 to 25 carbon atoms, and particularly preferably 6 to 20 carbon atoms, examples of which include a triphenylsiloxy group, a triethoxysiloxy group, and a triisopropylsiloxy group); aromatic hydrocarbon anion ligands (having preferably 6 to 30 carbon atoms, more preferably 6 to 25 carbon atoms, and particularly preferably 6 to 20 carbon atoms, examples of which include a phenyl anion, a naphthyl anion, and an anthranyl anion); aromatic heterocyclic anion ligands (having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, and a benzothiophene anion); and indolenine anion ligands. Among these, nitrogen-containing heterocyclic ligands, aryloxy ligands, heteroaryloxy ligands, aromatic hydrocarbon anion ligands, aromatic heterocyclic anion ligands and siloxy ligands are preferable, and nitrogen-containing heterocyclic ligands, aryloxy ligands, siloxy ligands, aromatic hydrocarbon anion ligands, and aromatic heterocyclic anion ligands are more preferable.

Examples of the metal complex electron-transporting hosts include compounds described in, for example, JP-A Nos. 2002-235076, 2004-214179, 2004-221062, 2004-221065, 2004-221068, and 2004-327313.

In the light-emitting layer according to the present invention, it is preferred that the lowest triplet excitation level (T1) of the host material is higher than T1 of the phosphorescent light-emitting material, in view of color purity, light-emission efficiency, and driving durability.

The content of the host compound according to the present invention is not particularly limited, and is preferably from 15% by weight to 95% by weight with respect to the total weight of the compounds forming the light-emitting layer, in view of light-emission efficiency and driving voltage.

(Hole Injection Layer and Hole Transport Layer)

A hole injection layer and a hole transport layer are layers functioning to receive holes from the anode or from the anode side and to transport the holes to the cathode side. Each of the hole injection material and the hole transport material used in these layers may independently be either a low molecular compound or a high molecular compound.

Specifically, the hole injection layer and the hole transport layer are each preferably a layer containing any of a pyrrole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrin compound, a thiophene derivative, an organic silane derivative, carbon, or the like.

An electron-accepting dopant may be introduced into the hole injection layer or the hole transport layer in the organic EL element according to the present invention. As the electron-accepting dopant to be introduced into the hole injection layer or hole transport layer, either of an inorganic compound or an organic compound may be used as long as the compound has electron accepting property and functions to oxidize an organic compound.

Specifically, examples of the inorganic compound as an electron-accepting dopant include metal halides, such as iron (III) chloride, aluminum chloride, gallium chloride, indium chloride and antimony pentachloride, and metal oxides, such as vanadium pentaoxide and molybdenum trioxide.

Examples of the organic compound as an electron-accepting dopant include: compounds having, as a substituent, a nitro group, a halogen atom, a cyano group, a trifluoromethyl group or the like; quinone compounds; acid anhydride compounds; fullerenes; and compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, and 2,3,5,6-tetracyanopyridine are more preferred, and tetrafluorotetracyanoquinodimethane is particularly preferred.

The electron-accepting dopant may be used singly, or in combination of two or more thereof.

The amount of the electron-accepting dopant to be used depends on the type of material, and is preferably 0.01% by weight to 50% by weight, 0.05% by weight to 20% by weight is more preferable, and 0.1% by weight to 10% by weight is particularly preferred, with respect to the total amount of the hole transport layer or hole injection layer.

The thickness of the hole injection layer and the thickness of the hole transport layer are each preferably 500 nm or less in view of decrease in driving voltage.

The thickness of the hole transport layer is preferably from 1 nm to 500 nm, more preferably from 5 nm to 200 nm, and even more preferably from 10 nm to 100 nm. The thickness of the hole injection layer is preferably from 0.1 nm to 200 nm, more preferably from 0.5 nm to 100 nm, and even more preferably from 1 nm to 100 nm.

Each of the hole injection layer and the hole transport layer may be composed of a monolayer structure containing one of, or two or more of, the above-mentioned materials, or a multilayer structure composed of plural layers, in which the respective layers may have the same composition as each other or different compositions from each other.

(Electron Injection Layer and Electron Transport Layer)

An electron injection layer and an electron transport layer are layers functioning to receive electrons from the cathode or the cathode side and to transport the electrons to the anode side. Each of the electron injection material and the electron transport material used in these layers may independently be either a low molecular compound or a high molecular compound.

Specifically, the electron injection layer and the electron transport layer are each preferably a layer containing any of a pyridine derivative, a quinoline derivative, a pyrimidine derivative, a pyrazine derivative, a phthalazine derivative, a phenanthoroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, an aromatic ring tetracarboxylic anhydride such as perylenetetracarboxylic anhydride or naphthalenetetracarboxylic anhydride, a phthalocyanine derivative, a metal complex (typical examples of which include a metal complex of a 8-quinolinol derivative, a metal phthalocyanine, or a metal complex containing benzoxazole or benzothiazole as a ligand), an organic silane derivative (typical examples of which include silole), or the like.

The electron injection layer or the electron transport layer in the organic EL element according to the invention may contain an electron donating dopant. As the electron donating dopant to be introduced into the electron injection layer or the electron transport layer, any material may be used as long as it has an electron-donating property and a property of reducing an organic compound. Preferable examples of the electron donating dopant include alkaline metals such as Li, alkaline earth metals such as Mg, transition metals including rare-earth metals, and reducing organic compounds. As the metals, particularly, metals having a work function of 4.2 V or less are preferable, and specific examples thereof include Li, Na, K, Be, Mg, Ca, Sr, Ba, Y, Cs, La, Sm, Gd, and Yb. Specific examples of the reducing organic compounds include nitrogen-containing compounds, sulfur-containing compounds, and phosphorus-containing compounds.

Other materials are also usable as the electron donating dopant, such as materials described in JP-A Nos. 6-212153, 2000-196140, 2003-68468, 2003-229278 and 2004-342614.

The electron donating dopant may be used singly, or in combination of two or more thereof. The amount of the electron donating dopant to be used varies depending on the type of material, and is preferably from 0.1% by weight to 99% by weight, more preferably from 1.0% by weight to 80% by weight, and even more preferably from 2.0% by weight to 70% by weight, with respect to the total amount of the electron transport layer or electron injection layer.

The thickness of the electron injection layer and the thickness of the electron transport layer are each preferably 500 nm or less in view of decrease in driving voltage.

The thickness of the electron transport layer is preferably from 1 nm to 500 nm, more preferably from 5 nm to 200 nm, and even more preferably from 10 nm to 100 nm. The thickness of the electron injection layer is preferably from 0.1 nm to 200 nm, more preferably from 0.2 nm to 100 nm, and even more preferably from 0.5 nm to 50 nm.

Each of the electron injection layer and the electron transport layer may be composed of a monolayer structure containing one of, or two or more of, the above-mentioned materials, or a multilayer structure composed of plural layers, in which the respective layers may have the same composition as each other or different compositions from each other.

(Hole Blocking Layer)

A hole blocking layer is a layer having a function to prevent the holes, which have been transported from the anode side to the light-emitting layer, from passing through to the cathode side. In the present invention, a hole blocking layer may be provided as an organic compound layer adjacent to the light-emitting layer at the cathode side of the light-emitting layer.

Examples of the compound constituting the hole blocking layer include an aluminum complex such as BAlq (aluminium (III) bis(2-methyl-8-quinolinato)-4-phenylphenolate), a triazole derivative, and a phenanthroline derivative such as BCP (2,9-dimethyl-4,7-diphenyl-1,10-phenanthroline).

The thickness of the hole blocking layer is preferably from 1 nm to 500 nm, more preferably from 5 nm to 200 nm, and even more preferably from 10 nm to 100 nm.

The hole blocking layer may have either a monolayer structure containing one of, or two or more of, the above-mentioned materials, or a multilayer structure composed of plural layers, in which the respective layers may have the same composition as each other or different compositions from each other.

(Electron Blocking Layer)

An electron blocking layer is a layer having a function to prevent the electrons, which have been transported from the cathode side to the light-emitting layer, from passing through to the anode side. According to the present invention, an electron blocking layer may be provided as an organic compound layer adjacent to the light-emitting layer at the anode side of the light-emitting layer. Specific examples of the compound constituting the electron blocking layer include the compounds described above as examples of the hole transport material.

The thickness of the electron blocking layer is preferably from 1 nm to 500 nm, more preferably from 5 nm to 200 nm, and even more preferably from 10 nm to 100 nm.

The electron blocking layer may have either a monolayer structure containing one of, or two or more of, the above-mentioned materials, or a multilayer structure composed of plural layers, in which the respective layers may have the same composition as each other or different compositions from each other.

(Protective Layer)

According to the present invention, the whole organic EL element may be protected by a protective layer.

The material contained in the protective layer may be any material having a function to prevent penetration of substances, such as moisture and oxygen, which accelerate deterioration of the element, into the element.

Specific examples thereof include metal oxides such as $MgO$, $SiO$, $SiO_2$, $Al_2O_3$, $GeO$, $NiO$, $CaO$, $BaO$, $Fe_2O_3$, $Y_2O_3$, and $TiO_2$; metal nitrides such as $SiN_x$ and $SiN_xO_y$; metal fluorides such as $MgF_2$, $LiF$, $AlF_3$, and $CaF_2$; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; a copolymer obtained by copolymerizing a monomer mixture containing tetrafluoroethylene and at least one comonomer; a fluorine-containing copolymer having a cyclic structure in the copolymerization main chain; water-absorbing materials having a coefficient of water absorption of 1% or more; and moisture-proof substances having a coefficient of water absorption of 0.1% or less.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence element according to the present invention may be sealed using a sealing container.

Furthermore, a moisture absorbent or an inert liquid may be filled into a space between the sealing container and the electroluminescence element.

The moisture absorbent is not particularly limited, and specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and specific examples thereof include paraffins; liquid paraffins; fluorocarbon solvents such as perfluoroalkanes, perfluoroamines, and perfluoroethers; chlorine-based solvents; and silicone oils.

It is also preferable to use a sealing method using the resin sealing layer described below.

(Resin Sealing Layer)

The deterioration in the performance of the functional element according to the present invention caused by contact with the atmosphere (including oxygen and moisture) is preferably prevented using a resin sealing layer.

<Material>

The resin material for the resin sealing layer is not particularly limited, and examples thereof include acrylic resins, epoxy resins, fluorocarbon resins, silicone resins, rubber resins, and ester resins. Among these, epoxy resins are preferred in view of moisture preventive function. Among the epoxy resins, thermosetting epoxy resins or photo-curable epoxy resins are preferred.

<Manufacturing Method>

The manufacturing method of the resin sealing layer is not particularly limited, and examples thereof include a method of coating a resin solution, a method of press-bonding or hot-press-bonding a resin sheet, and a method of dry polymerization using vapor deposition, sputtering, or the like.

<Film Thickness>

The thickness of the resin sealing layer is preferably from 1 μm to 1 mm, more preferably from 5 μm to 100 μm, and most preferably from 10 μm to 50 μm. If the thickness of the resin sealing layer is less than 1 μm, the inorganic layer described above may possibly be damaged when a second substrate is attached. Further, if the thickness of the resin sealing layer is more than 1 mm, the thickness of the electroluminescence element itself increases, and thinness of the element, which is a feature characteristic to organic electroluminescence elements, is impaired.

(Sealing Adhesive)

The sealing adhesive used in the invention has a function of preventing intrusion of moisture or oxygen from the edge portion.

<Material>

As the material for the sealing adhesive, those mentioned above as materials used in the resin sealing layer can be used. In particular, an epoxy adhesive is preferred in view of preventing moisture, and a photo-curable type adhesive or a thermosetting type adhesive is particularly preferred.

Further, addition of a filler to the materials described above is also preferred.

The filler added to the sealant is preferably an inorganic material such as $SiO_2$, SiO (silicon oxide), SiON (silicon oxynitride), or SiN (silicon nitride). The addition of the filler increases the viscosity of the sealant, and also improves workability and humidity resistance.

<Drying Agent>

The sealing adhesive may contain a drying agent. The drying agent is preferably barium oxide, calcium oxide, or strontium oxide.

The addition amount of the drying agent relative to the amount of the sealing adhesive is preferably from 0.01% by weight to 20% by weight, and more preferably from 0.05% by weight to 15% by weight. The effect of the addition of the drying agent is reduced if the addition amount thereof is less than 0.01% by weight. Further, if the addition amount of the drying agent is more than 20% by weight, it is difficult to uniformly disperse the drying agent in the sealing adhesive, which is unfavorable.

<Formulation of Sealing Adhesive>

—Polymer Composition and Concentration—

The sealing adhesive is not particularly limited, and those described above can be used. For example, examples of photo-curable epoxy type adhesives include XNR5516 manufactured by Nagase Chemtech Co.; the drying agent may be directly added to and dispersed in such an adhesive.

—Thickness—

The coating thickness of the sealing adhesive is preferably from 1 μm to 1 mm. When the thickness is less than 1 μm, the sealing adhesive cannot be coated uniformly, which is unfavorable. Further, when the thickness is more than 1 mm, moisture intrusion paths are widened, which is unfavorable.

<Sealing Method>

In the invention, for example, the sealing adhesive including a drying agent is coated in a desired amount using a dispenser or the like, a second substrate is superposed thereon after the coating, and the sealing adhesive is cured to obtain a functional element.

(Driving)

In the organic EL element according to the present invention, light emission can be obtained by applying a DC (AC components may be contained as needed) voltage (usually 2 volts to 15 volts) or direct current between the anode and the cathode.

For the driving method of the organic EL element according to the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

In the organic EL element according to the present invention, the light-extraction efficiency thereof can be improved by various known methods. It is possible to improve light-extraction efficiency and external quantum efficiency, for example, by modifying the surface shape of the substrate (for example by forming fine irregularity pattern), or by regulating the refractive indices of the substrate, the ITO layer and the organic compound layer, or by regulating the thicknesses of the substrate, the ITO layer and the organic compound layer.

The organic EL element according to the present invention may have a so-called top-emission configuration in which the emitted light is extracted from the anode side.

The organic EL element according to the present invention may take a configuration that has an electric charge-generating layer provided between plural light-emitting layers, for the purpose of enhancing light-emission efficiency.

The electric charge-generating layer has a function of generating electric charges (holes or electrons) when an electric field is applied, as well as a function of injecting the generated electric charges into a layer adjacent to the electric charge-generating layer.

The electric charge-generating layer may be formed by any material as long as it has the aforementioned functions, and may be formed by a single compound or plural compounds.

Specifically, the electric charge-generating layer material may be any of an electrically conductive material, a semiconductive material such as a doped organic compound layer, or an electric insulating material. Examples thereof include materials described in JP-A Nos. 11-329748, 2003-272860 and 2004-39617.

More specific examples thereof include transparent electrically conductive materials such as indium tin oxide (ITO) and indium zinc oxide (IZO); fullerenes such as C60; electrically conductive organic substances such as thiophene oligomers; electrically conductive organic substances such as metal phthalocyanines, metal-free phthalocyanines, metal porphyrins and metal-free porphyrins; metal materials such as Ca, Ag, Al, Mg—Ag alloys, Al—Li alloys and Mg—Li alloys; hole conductive materials; electron conductive materials, and mixtures thereof.

Specific examples of the hole conductive materials include: a material obtained by doping a hole transport organic material such as 4,4',4''-tris(2-naphthylphenylamino)triphenylamine (2-TNATA) or N,N'-dinaphthyl-N,N'-diphenyl[1,1'-biphenyl]-4,4'-diamine (NPD) with an oxidizing agent having electron attracting property such as 2,3,5,6-tetrafluoro-7,7,8,8-tetracyanoquinodimethane (F4-TCNQ), 7,7,8,8-tetra-cyanoquinodimethane (TCNQ), or $FeCl_3$; P-type electrically conductive polymers; and P-type semiconductors. Specific examples of the electron conductive materials include: a material obtained by doping an electron transport organic material with a metal or metal compound having a work function of less than 4.0 eV; N-type electrically conductive polymers; and N-type semiconductors. Specific examples of the N-type semiconductors include N-type Si, N-type CdS, and N-type ZnS. Specific examples of the P-type semiconductors include P-type Si, P-type CdTe, and P-type CuO.

Further, the electric charge-generating layer may include an electric insulating material such as $V_2O_5$.

The electric charge-generating layer can be formed by a single layer or by plural layers that are superposed on each other. Specific examples of a structure having plural layers superposed on each other include a structure in which an electrically conductive material, such as a transparent conductive material or a metal material, and a hole conductive material or an electron conductive material are superposed on each other; and a structure in which the hole conductive material and the electron conductive material described above are superposed on each other.

In general, the thickness and material of the electric charge-generating layer may be selected so as to possess a visible light transmittance of 50% or more. Further, the thickness of the electric charge-generating layer is not particularly limited, and is preferably from 0.5 nm to 200 nm, more preferably from 1 nm to 100 nm, even more preferably from 3 nm to 50 nm, and particularly preferably from 5 nm to 30 nm.

The method of preparing the electric charge-generating layer is not particularly limited, and the above-described method of preparing organic compound layers can be used.

The electric charge-generating layer is formed between the two or more light-emitting layers. However, a material having a function of injecting an electric charge into an adjacent layer may be contained in at least one of a region of the electric charge-generating layer at the anode side or a region of the electric charge-generating layer at the cathode side. In order to enhance injection ability of electrons into an adjacent layer at the anode side of the electron charge-generating layer, an electron injecting compound such as BaO, SrO, $Li_2O$, LiCl, LiF, $MgF_2$, MgO, or $CaF_2$ may be deposited on the anode side of the electric charge-generating layer to form a layer.

Other than the above, the electric charge-generating layer material may be selected with reference to the descriptions in JP-A No. 2003-45676, and U.S. Pat. Nos. 6,337,492, 6,107,734, and 6872472.

The organic EL element in the invention may have a resonator structure. For example, a multi-layer film mirror composed of plural films that have different refractive indices and that are superposed on each other, a transparent or semi-transparent electrode, a light-emitting layer, and a metal electrode may be superposed on a transparent substrate. Light generated in the light-emitting layer repeats reflection between the multi-layer film mirror and the metal electrode, which serve as reflection plates, and thus resonates (first embodiment).

In another preferred embodiment of the resonator structure, a transparent or semi-transparent electrode and a metal electrode are disposed on a transparent substrate such that a light-emitting layer is sandwiched between the transparent or semi-transparent electrode and the metal electrode. The transparent or semi-transparent electrode and the metal electrode serve as reflection plates, and light generated in the light-emitting layer repeats reflection between the transparent or semi-transparent electrode and the metal electrode and resonates (second embodiment).

In order to form a resonance structure, an optical path length determined based on the effective refractive indices of the two reflection plates and the refractive indices and thicknesses of the respective layers positioned between the reflection plates are regulated to optimal values for obtaining a desired resonance wavelength.

A calculation formula for the first embodiment is described in JP-A No. 9-180883, and a calculation formula for the second embodiment is described in JP-A No. 2004-127795.

As a method for forming a full color-type organic EL display, for example, the following methods are known as described in Monthly Display, September 2000, pages 33 to 37:

a tricolor light emission method in which organic EL elements emitting lights corresponding to three primary colors (blue color (B), green color (G), and red color (R)) are arranged on a substrate, wherein each organic EL element emits light corresponding to one of the three primary colors;

a white color method in which white light emitted by an organic EL element for white color emission is separated, through a color filter, into three primary colors; and a color conversion method in which a blue light emitted by an organic EL element for blue light emission is converted, by a fluorescent dye layer, into red color (R) and green color (G).

Further, a planar type light source of a desired emission color can be obtained by combining plural organic EL elements of different light emission colors obtained by the methods described above. For example, a white color light source may be obtained by a combination of blue and yellow light-emitting elements, and a white color light source may be obtained alternatively by a combination of blue, green and red color light-emitting elements.

4. Protective Insulating Layer

In the organic EL display of the invention, the whole top surface of the organic EL element may be protected with a protective insulating layer. The protective insulating layer has a function to reduce damage to the organic EL element when forming a TFT on the organic EL element, and a function to electrically insulate the organic EL element from the TFT. It is further preferred that the protective insulating layer has a function to prevent penetration of substances which accelerate deterioration of the element, such as moisture and oxygen, into the element.

Specific examples of a material for the protective insulating layer include metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$ and $SiN_xO_y$; metal fluorides such as $MgF_2$, LiF, $AlF_3$, and $CaF_2$; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; a copolymer obtained by copolymerizing a monomer mixture containing tetrafluoroethylene and at least one comonomer; a fluorine-containing copolymer having a cyclic structure in the copolymerization main chain; water-absorbing materials having a coefficient of water absorption of 1% or more; and moisture-proof substances having a coefficient of water absorption of 0.1% or less.

There is no particular limitation as to a method for forming the protective insulating layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

The upper electrode of the organic EL element and the source electrode or drain electrode of the driver TFT have to be electrically connected to each other, and it is therefore necessary to form a contact hole in the protective insulating layer. Examples of the method of forming a contact hole include a wet etching method using an etching liquid, a dry etching method using a plasma and an etching method using a laser.

The disclosure of Japanese Patent Application No. 2009-148842 filed on Jun. 23, 2009 is incorporated herein by reference.

EXAMPLES

In the following, the thin film field effect transistor of the present invention is described by way of examples thereof. However, the examples should not be construed as limiting the invention.

Example 1

1. Preparation of TFT Element

1) Preparation of TFT Elements 1 to 4

As a substrate, a non-alkali glass substrate (#1737, manufactured by Corning Inc.) was used. The substrate was subjected to ultrasonic cleaning with pure water for 15 minutes, acetone for 15 minutes, and pure water for 15 minutes in this order. On this cleaned substrate, RF magnetron sputtering (conditions: flow rate of argon (Ar) (as sputtering gas) of 13 sccm and RF power of 380 W) was performed to form a thin molybdenum (Mo) layer (with a thickness of 40 nm) as a gate electrode. Patterning of the gate electrode (Mo thin layer) was performed using a photolithography method in which a desired pattern was formed through light exposure and development of a photoresist layer.

Next, on the gate electrode, the following gate insulating layer was formed.

Gate insulating layer: a gate insulating layer was formed by performing RF magnetron sputtering of $SiO_2$ (conditions: the target was $SiO_2$, the sputtering gas was Ar/oxygen ($O_2$) at flow rates of 12 sccm/2 sccm, and the RF power was 400 W) to form a layer having a thickness of 200 nm. Patterning of the $SiO_2$ gate insulating layer was performed using a photolithography method.

Active Layer:
<Condition 1>
On the gate insulating layer, an active layer was formed using $InGaZnO_4$ under the following conditions.
Using a polycrystalline sintered body having a composition of $InGaZnO_4$ as a target, RF magnetron sputtering was performed under the following conditions: the flow rate of Ar was 97 sccm, the flow rate of $O_2$ was 0.8 sccm, and the RF power was 200 W. The film-formation time was adjusted to obtain a desired film thickness. The obtained film thickness is as shown in Table 1 below.
<Condition 2>
On the gate insulating layer, an active layer was formed using IZO under the following conditions.
Using a polycrystalline sintered body having a composition of $In_2O_3$-10.7% ZnO as a target, Rf magnetron sputtering was performed under the following conditions: the flow rate of Ar was 97 sccm, the flow rate of $O_2$ was 1.5 sccm, and the RF power was 200 W. The film-formation time was adjusted to obtain a desired film thickness. The obtained film thickness was 2.5 nm.

—Measurement of Electric Conductivity—

The electric conductivity of a measurement sample was obtained by calculation based on the measured sheet resistance of the sample and the film thickness of the sample. Assuming that the sheet resistance is $\rho(\Omega/sq)$ and the film thickness is d (cm), the electric conductivity a $(Scm^{-1})$ is calculated from an expression, $\sigma=1/(\rho \times d)$.

In this Example, the electric conductivity was measured at 20° C., using a LORESTA GP (tradename, manufactured by Mitsubishi Chemical Analytech Co., Ltd.) if the sheet resistance of a measurement sample is less than $10^7$ $\Omega$/sq, and using a HIRESTA UP (tradename, manufactured by Mitsubishi Chemical Analytech Co., Ltd.) if the sheet resistance of the measurement sample is $10^7$ $\Omega$/sq or more. The film thickness of the measurement sample was measured using a stylus surface profiler DEKTAK-6M (tradename, manufactured by ULVAC Inc.).

Electric Resistance Layer:
<Condition 1>
On the active layer, an electric resistance layer was formed using $InGaZnO_4$ under the following conditions, so as to cover the entire top surface of the active layer (a surface perpendicular to the thickness direction) and the entire edge surfaces of the active layer.
Using a polycrystalline sintered body having a composition of $InGaZnO_4$ as a target, RF magnetron sputtering was performed under the following conditions: the flow rate of Ar was 13 sccm, the flow rate of $O_2$ was 1.5 sccm, and the RF power was 200 W. The film-formation time was adjusted to obtain a desired film thickness. The obtained film thickness is as shown in Table 1 below. Patterning was performed using a photolithography method.
<Condition 2>
On the active layer, an electric resistance layer was formed using $Ga_2O_3$ under the following conditions, so as to cover the entire top surface of the active layer (a surface perpendicular to the thickness direction) and the entire edge surfaces of the active layer. RF magnetron sputtering was performed under the following conditions: the flow rate of Ar was 12 sccm, the flow rate of $O_2$ was 5.0 sccm, the pressure was 0.4 Pa, and the RF power was 400 W. The film-formation time was adjusted to obtain a desired film thickness. The obtained film thickness was 20 nm. Patterning was performed using a photolithography method.

Then, on the electric resistance layer, indium tin oxide (ITO) with a thickness of 40 nm was deposited as a source electrode and a drain electrode, by performing RF magnetron sputtering (conditions: flow rate of sputtering gas (Ar) of 13 sccm and RF power of 40 W). Patterning of the source electrode and drain electrode was performed using a photolithography method.

Protective layer: onto the surface of the structure thus constructed, a coating liquid including a photosensitive acrylic resin (PC-405G manufactured by JSR Corporation) was applied and dried to form a coating layer with a thickness of 2 μm, which served as a protective layer. Since the electric resistance layer covered the active layer, the protective layer did not contact with the active layer. At a portion corresponding to a terminal on the source electrode, the resin layer was removed using a photolithography method, whereby an opening for a terminal was provided.

Thereby, TFT elements 1 to 4 according to the invention, which had an inverted staggered structure with a channel length (L) of 200 μm and a channel width (W) of 1,000 μm, were prepared.

2) Preparation of Comparative TFT Element A

A comparative TFT element A was prepared in the same manner as the preparation of the TFT element 1, except that the electric resistance layer was not formed and the thickness of the active layer was changed to 50 nm.

3) Preparation of Comparative TFT Element B

A comparative TFT element B was prepared in the same manner as the preparation of the TFT element 1, except that the electric resistance layer was not formed, the thickness of the active layer was changed to 50 nm, and further, the protective layer was not formed.

2. Performance Evaluation

For each of the obtained TFT elements, TFT transfer characteristics was measured at a drain voltage Vd of +40 V, which is in a saturation region, and a gate voltage Vg changed within a range of $-20\,V \leq Vg \leq +40\,V$, assuming that the voltage of the source electrode was 0 V, and performance of the TFT was evaluated. The measurement of the TFT transfer characteristics was performed using a semiconductor parameter analyzer 4156C (manufactured by Agilent Technologies, Inc.).

The TFT performances based on the measurements described above are shown in Table 1 below. As a result, in the comparative TFT element B, moisture influenced on the active layer, and therefore, the OFF current increased to give a low ON/OFF ratio.

Concerning the comparative TFT element A, the acrylic resin in the protective layer and the active layer directly contacted with each other, so that the acrylic resin was oxidized to reduce the oxide semiconductor in the active layer, resulting in increase in the number of carriers in the oxide semiconductor, and a phenomenon in which the threshold voltage greatly shifted. In the TFT elements 1 to 4 according to Example 1 of the present invention, the electric resistance layer prevented the redox reaction between the acrylic resin and the active layer, and the threshold voltage did not shift greatly.

TABLE 1

| | Active Layer | | | Electric Resistance Layer | | | Ratio | | Performance | | |
|---|---|---|---|---|---|---|---|---|---|---|---|
| | Material | Thickness (nm) | Electric Conductivity ($Scm^{-1}$) | Material | Thickness (nm) | Electric Conductivity ($Scm^{-1}$) | between Electric Resistances | Resin Protective Layer | ON/OFF Ratio | Threshold Value (V) | Remarks |
| TFT Element 1 | IGZO | 50 | $4.0 \times 10^{-5}$ | IGZO | 20 | $6.0 \times 10^{-11}$ | $6.7 \times 10^{+5}$ | Present | $7.0 \times 10^{+6}$ | −1 | Invention |
| TFT Element 2 | | | | $Ga_2O_3$ | 20 | $3.0 \times 10^{-7}$ | $1.3 \times 10^{+2}$ | Present | $5.0 \times 10^{+7}$ | −2 | Invention |
| TFT Element A | | | | Not Formed | — | — | — | Present | $8.0 \times 10^{+6}$ | −12 | Comparative Example |
| TFT Element B | | | | Not Formed | — | — | — | Absent | $7.0 \times 10^{+3}$ | −4 | Comparative Example |
| TFT Element 3 | IGZO | 10 | $3.2 \times 10^{-5}$ | IGZO | 40 | $2.0 \times 10^{-8}$ | $1.6 \times 10^{+3}$ | Present | $4.0 \times 10^{+6}$ | −1 | Invention |
| TFT Element 4 | IZO | 2.5 | $5.0 \times 10^{-4}$ | IGZO | 40 | $5.0 \times 10^{-11}$ | $1.0 \times 10^{+7}$ | Present | $4.0 \times 10^{+7}$ | −1 | Invention |

Example 2

A TFT element was prepared in the same manner as the preparation of the TFT element 1 in Example 1, except that a film having barrier layers (the following insulating layers having a barrier function), in which the insulating layers were provided at both sides of a polyethylene naphthalate film (having a thickness of 100 μm), was used instead of the non-alkali glass substrate used in the TFT element 1.

Insulating layer: silicon oxynitride (SiON) was deposited to a thickness of 500 nm. For the deposition of SiON, an RF magnetron sputtering method (conditions for sputtering: the target was $Si_3N_4$, the RF power was 400 W, the gas flow rates was "Ar/$O_2$=12 sccm/3 sccm", and the film-forming pressure was 0.45 Pa) was applied.

The obtained element was evaluated in the same manner as in Example 1. As a result, the element exhibited unexpectedly extremely high ON current and excellent performance suitable for driving an organic EL display, similarly to the results of the TFT element 1.

Example 3

1. Preparation of Organic EL Display (Preparation of Organic EL Element Part)
1) Formation of Lower Electrode As a substrate, the film in which the insulating layers having a barrier function were provided at both sides of a polyethylene naphthalate film was used. On the substrate, indium tin oxide (which is referred to hereinafter as ITO) was deposited to a thickness of 150 nm, which served as an anode.

2) Formation of Organic Compound Layer

After cleaning, a hole injection layer, a hole transport layer, a light-emitting layer, a hole blocking layer, an electron transport layer and an electron injection layer were provided in this order.

The compositions of the respective layers are as follows. Each layer was provided by resistance heating vacuum deposition.

Hole injection layer: a layer having a thickness of 160 nm and containing 4,4',4''-tris(2-naphthylphenylamino)triphenylamine (which is referred to as 2-TNATA) and 2,3,5,6-tetrafluoro-7,7,8,8-tetracyanoquinodimethane (which is referred to as F4-TCNQ), wherein the amount of F4-TCNQ was 1% by weight with respect to 2-TNATA.

Hole transport layer: a layer of N,N'-dinaphthyl-N,N'-diphenyl-[1,1'-biphenyl]-4,4'-diamine (which is referred to as α-NPD), having a thickness of 10 nm.

Light-emitting layer: a layer having a thickness of 60 nm and containing 1,3-bis(carbazol-9-yl)benzene (which is referred to as mCP) and platinum complex Pt-1, wherein the amount of Pt-1 was 13% by weight with respect to mCP.

Hole blocking layer: a layer of aluminium (III) bis(2-methyl-8-quinolinato)-4-phenylphenolate (which is referred to as BAlq), having a thickness of 40 nm.

Electron transport layer: a layer of tris(8-hydroxyquinolinato) aluminum (which is referred to as Alq3), having a thickness of 10 nm.

Electron injection layer: a layer of lithium fluoride (LiF), having a thickness of 1 nm.

3) Formation of Upper Electrode

Patterning was performed using a shadow mask so that the size of the element became 2 mm×2 mm, and aluminum metal (Al) was deposited to a thickness of 100 nm to form a cathode.

(Protective Insulating Layer)

On the upper electrode, as a protective insulating layer, an SiON layer with a thickness of 500 nm was formed using an ion plating method. After forming the layer, a contact hole was formed using a laser beam.

The chemical structures of the compounds used in Examples are shown below.

2-TNATA

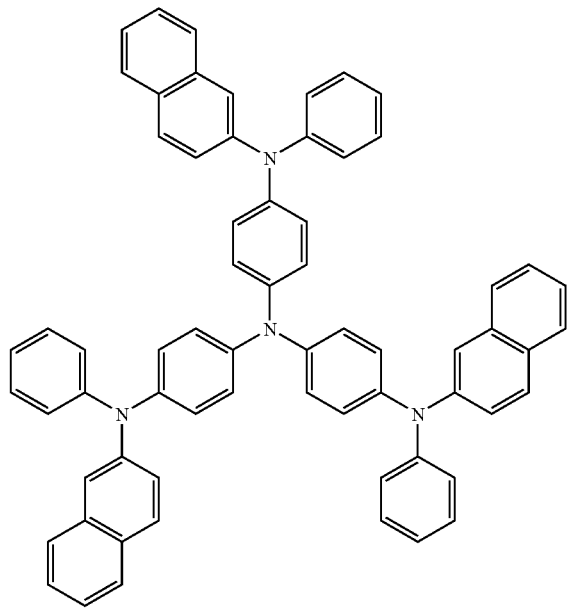

α-NPD

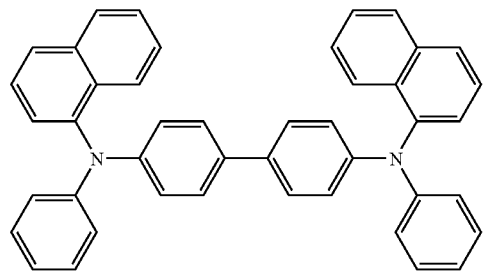

F4-TCNQ

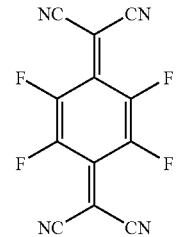

mCP

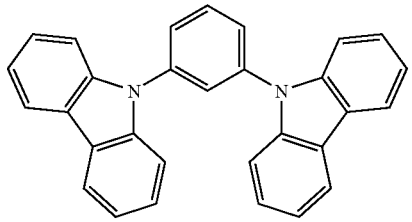

Pt-1

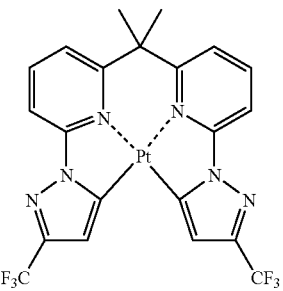

BAlq

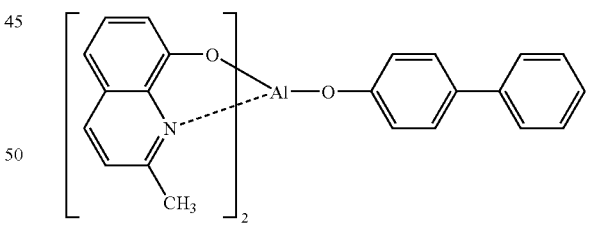

Alq3

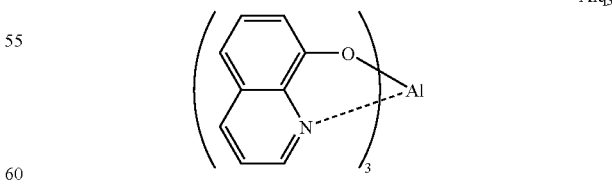

(Driving Test)

The obtained organic EL element and the TFT element 1 prepared in Example 1 were combined to constitute an equivalent circuit, and driving tests were performed under various conditions.

As a result, by using the TFT according to the invention, stable light emission was obtained even when driven under an environment of high temperature, and even when driven continuously for a long time.

(Applications)

The thin film field effect transistor of the invention can be used in image displays in which liquid crystals or EL elements are used, and especially the TFT of the invention can be used as a switching element or a driving element of an FPD. It is particularly suitable to use the TFT as a switching element or a driving element of a flexible FPD device. Further, a display incorporating the thin film field effect transistor of the invention has wide ranging applications including mobile phone displays, personal digital assistants (PDAs), computer displays, car information displays, TV monitors, and general illuminations.

In addition to displays, the TFT of the invention can be applied extensively to e.g., IC cards, and ID tags, in which the thin film field effect transistor is formed on a flexible substrate such as an organic plastic film.

All publications, patent applications, and technical standards mentioned in this specification are herein incorporated by reference to the same extent as if each individual publication, patent application, or technical standard was specifically and individually indicated to be incorporated by reference.

According to the invention, a TFT including an amorphous oxide semiconductor is provided which has a low OFF current, a high ON/OFF ratio, and an excellent drive stability with a reduced variation in the threshold value; a high-performance TFT which can be prepared on a flexible resin substrate is provided; a display using the TFT is also provided.

Exemplary embodiments of the present invention include those described below:

<1> A thin film field effect transistor including at least: a substrate; and a gate electrode, a gate insulating layer, an active layer, a source electrode and a drain electrode, and a protective layer provided on the substrate in this order from the substrate side, wherein the active layer is a layer containing an amorphous oxide containing at least one metal selected from the group consisting of In, Sn, Zn and Cd, and the thin film field effect transistor further includes, between the active layer and at least one of the source electrode or the drain electrode, an electric resistance layer containing an oxide or nitride containing at least one metal selected from the group consisting of Ga, Al, Mg, Ca and Si.

<2> A thin film field effect transistor as described in <1>, wherein the electric resistance layer is disposed between the protective layer and the active layer.

<3> A thin film field effect transistor as described in <1> or <2>, wherein the protective layer is a resin layer.

<4> A thin film field effect transistor as described in any one of <1> to <3>, wherein the protective layer includes a photosensitive resin.

<5> A thin film field effect transistor as described in any one of <2> to <4>, wherein at least one edge portion of the active layer is covered with the electric resistance layer, and the protective layer and the active layer do not directly contact with each other at the edge portion.

<6> A thin film field effect transistor as described in <1>, wherein the electric conductivity of the active layer is $10^{-10}$ $Scm^{-1}$ or more but less than $10^{1}$ $Scm^{-1}$.

<7> A thin film field effect transistor as described in <2>, wherein a ratio of the electric conductivity of the active layer to the electric conductivity of the electric resistance layer (electric conductivity of active layer/electric conductivity of electric resistance layer) is from $10^{2}$ to $10^{8}$.

<8> A thin film field effect transistor as described in any one of <1> to <7>, wherein the active layer includes an amorphous oxide containing at least In.

<9> A thin film field effect transistor as described in <8>, wherein the amorphous oxide further contains Zn.

<10> A thin film field effect transistor as described in any one of <1> to <9>, wherein the electric resistance layer contains an oxide or nitride of at least one metal selected from the group consisting of Ga, Al and Mg.

<11> A thin film field effect transistor as described in <10>, wherein the electric resistance layer contains an oxide of at least one metal selected from the group consisting of Ga, Al and Mg.

<12> A thin film field effect transistor as described in any one of <1> to <11>, wherein the substrate is a flexible substrate.

<13> A display including:
a pair of electrodes;
a light-emitting element provided between the electrodes and including an organic compound layer including at least a light emitting layer; and
the thin film field effect transistor of any one of <1> to <12> for driving the light-emitting element.

What is claimed is:

1. A thin film field effect transistor comprising at least:
a substrate; and a gate electrode, a gate insulating layer, an active layer, a source electrode and a drain electrode, and a protective layer provided on the substrate in this order from the substrate side, wherein
the active layer is a layer containing an amorphous oxide containing at least one metal selected from the group consisting of In, Sn, Zn and Cd, and the thin film field effect transistor further comprises, between the active layer and at least one of the source electrode or the drain electrode, an electric resistance layer containing an oxide or nitride containing at least one metal selected from the group consisting of Ga, Al, Mg, Ca and Si,
the electric resistance layer is disposed between the protective layer and the active layer, and
at least one longitudinal end surface of the active layer along the source-drain direction is covered with the electric resistance layer, and the protective layer and the active layer do not directly contact with each other at the at least one longitudinal end surface, wherein the at least one longitudinal end surface of the active layer is a side surface that is substantially perpendicular to the substrate,
and wherein a ratio of an electric conductivity of the active layer relative to an electric conductivity of the electric resistance layer (electric conductivity of active layer/ electric conductivity of electric resistance layer) is from $10^{2}$ to $10^{8}$.

2. The thin film field effect transistor according to claim 1, wherein the protective layer is a resin layer.

3. The thin film field effect transistor according to claim 1, wherein the protective layer includes a photosensitive resin.

4. The thin film field effect transistor according to claim 1, wherein an electric conductivity of the active layer is $10^{-10}$ $Scm^{-1}$ or more but less than $10^{1}$ $Scm^{-1}$.

5. The thin film field effect transistor according to claim 1, wherein the active layer comprises an amorphous oxide which contains at least In.

6. The thin film field effect transistor according to claim 5, wherein the amorphous oxide further contains Zn.

7. The thin film field effect transistor according to claim 1, wherein the electric resistance layer contains an oxide or nitride of at least one metal selected from the group consisting of Ga, Al and Mg.

8. The thin film field effect transistor according to claim 7, wherein the electric resistance layer contains an oxide of at least one metal selected from the group consisting of Ga, Al and Mg.

9. The thin film field effect transistor according to claim 1, wherein the substrate is a flexible substrate.

10. A display comprising:
a pair of electrodes;
a light-emitting element provided between the electrodes and including an organic compound layer including at least a light emitting layer; and
the thin film field effect transistor according to claim 1, wherein the thin film filed effect transistor is capable of driving the light-emitting element.

* * * * *